United States Patent
Kang et al.

(10) Patent No.: US 11,581,284 B2
(45) Date of Patent: Feb. 14, 2023

(54) SEMICONDUCTOR PACKAGE WITH UNDER-BUMP METAL STRUCTURE

(71) Applicant: SAMSUNG ELECTRONICS CO., LTD., Suwon-si (KR)

(72) Inventors: Myungsam Kang, Hwaseong-si (KR); Youngchan Ko, Seoul (KR); Jeongseok Kim, Cheonan-si (KR); Kyungdon Mun, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/203,372

(22) Filed: Mar. 16, 2021

(65) Prior Publication Data

US 2022/0052006 A1 Feb. 17, 2022

(30) Foreign Application Priority Data

Aug. 14, 2020 (KR) .................. 10-2020-0102372

(51) Int. Cl.
*H01L 23/00* (2006.01)
*H01L 23/498* (2006.01)
*H01L 23/522* (2006.01)

(52) U.S. Cl.
CPC ........ *H01L 24/14* (2013.01); *H01L 23/49811* (2013.01); *H01L 23/5226* (2013.01); *H01L 24/05* (2013.01)

(58) Field of Classification Search
CPC .............. H01L 24/14; H01L 23/49811; H01L 23/5226; H01L 24/05
See application file for complete search history.

(56) References Cited

U.S. PATENT DOCUMENTS

| 8,643,180 | B2 | 2/2014 | Shinkai et al. |
| 8,859,912 | B2 | 10/2014 | Tseng et al. |
| 10,026,668 | B1* | 7/2018 | Lee ................... H01L 25/18 |
| 2011/0266670 | A1 | 11/2011 | England et al. |
| 2015/0125993 | A1 | 5/2015 | Lee et al. |
| 2015/0179570 | A1 | 6/2015 | Marimuthu et al. |
| 2016/0276307 | A1 | 9/2016 | Lin |
| 2017/0186717 | A1 | 6/2017 | Gao |
| 2018/0197837 | A1 | 7/2018 | Yu et al. |
| 2020/0135453 | A1* | 4/2020 | Liu ..................... H01L 24/14 |
| 2021/0111120 | A1* | 4/2021 | Chen ................. H01L 23/5389 |
| 2021/0210414 | A1* | 7/2021 | Kang ................. H01L 23/5389 |
| 2021/0210427 | A1* | 7/2021 | Kang .................. H01L 24/14 |

(Continued)

FOREIGN PATENT DOCUMENTS

| KR | 20150051358 A | 5/2015 |
| KR | 102018616 B1 | 9/2019 |

*Primary Examiner* — Douglas W Owens
(74) *Attorney, Agent, or Firm* — Myers Bigel, P.A.

(57) ABSTRACT

A semiconductor package includes a redistribution structure including an insulating layer and a redistribution layer on the insulating layer, and having a first surface and a second surface opposing the first surface, and an under-bump metal (UBM) structure including an UBM pad protruding from the first surface of the redistribution structure, and an UBM via penetrating through the insulating layer and connecting the redistribution layer and the UBM pad. A lower surface of the UBM via has a first area in contact with the UBM pad, and a second area having a step configuration relative to the first area and that extends outwardly of the first area.

17 Claims, 25 Drawing Sheets

(56) References Cited

U.S. PATENT DOCUMENTS

| | | | |
|---|---|---|---|
| 2021/0265251 A1* | 8/2021 | Mun | H01L 23/49822 |
| 2021/0305189 A1* | 9/2021 | Jin | H01L 23/5226 |
| 2021/0343693 A1* | 11/2021 | Chang | H01L 25/18 |
| 2021/0407947 A1* | 12/2021 | Chen | H01L 23/53295 |

* cited by examiner

SEMICONDUCTOR PACKAGE WITH UNDER-BUMP METAL STRUCTURE

CROSS-REFERENCE TO RELATED APPLICATION(S)

This application claims the benefit under 35 USC 119(a) of Korean Patent Application No. 10-2020-0102372 filed on Aug. 14, 2020 in the Korean Intellectual Property Office, the entire disclosure of which is incorporated herein by reference for all purposes.

BACKGROUND

The present inventive concept relates to a semiconductor package.

Semiconductor packages are mounted on substrates (e.g., main boards) through various types of connection bumps. The reliability of connections between semiconductor packages and substrates may be affected by the connectivity of connection bumps and redistribution layers of semiconductor packages. To enhance board level reliability of a semiconductor package, an under-bump metal (UBM) structure may be formed between the redistribution layer and the connection bump.

SUMMARY

Example embodiments provide a semiconductor package having excellent board level reliability.

According to example embodiments, a semiconductor package includes a redistribution structure including an insulating layer and a redistribution layer on the insulating layer, and having a first surface and a second surface opposing the first surface, an under-bump metal (UBM) structure including a pad protruding from the first surface of the redistribution structure, and a UBM via penetrating through the insulating layer and connecting the redistribution layer and the UBM pad, a semiconductor chip disposed on the second surface of the redistribution structure and electrically connected to the redistribution layer, and an encapsulant disposed on the second surface of the redistribution structure and encapsulating at least portions of the redistribution structure and the semiconductor chip, and a connection bump on the UBM structure. A lower surface of the UBM via has a first area in contact with the pad, and a second area having a step configuration relative to the first area and that extends outwardly from the first area.

According to example embodiments, a semiconductor package includes a redistribution structure including a first insulating layer, a redistribution layer on the first insulating layer, a second insulating layer covering the redistribution layer, a first pad on the second insulating layer, and a first via penetrating through the second insulating layer and electrically connecting the redistribution layer and the first pad, the redistribution structure having a first surface and a second surface opposing the first surface, a UBM structure disposed on the first surface of the redistribution structure and including a second pad protruding from the first surface of the redistribution structure and a second via penetrating through the first insulating layer to connect the redistribution layer and the second pad, and a semiconductor chip disposed on the second surface of the redistribution structure and electrically connected to the redistribution layer. A minimum width of the second pad is greater than a minimum width of the first pad, and the minimum width of the second pad is less than a minimum width of the second via.

According to example embodiments, a semiconductor package includes a redistribution structure including an insulating layer and a redistribution layer on the insulating layer, and wherein the redistribution structure includes a first surface and a second surface opposing the first surface, a UBM structure disposed on the first surface of the redistribution structure, the UBM structure including a pad protruding from the first surface and a via penetrating through the insulating layer to connect the redistribution layer and the pad, and a semiconductor chip disposed on the second surface of the redistribution structure and electrically connected to the redistribution layer. The pad overlaps the via in a direction perpendicular to the first surface of the redistribution structure.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1A:
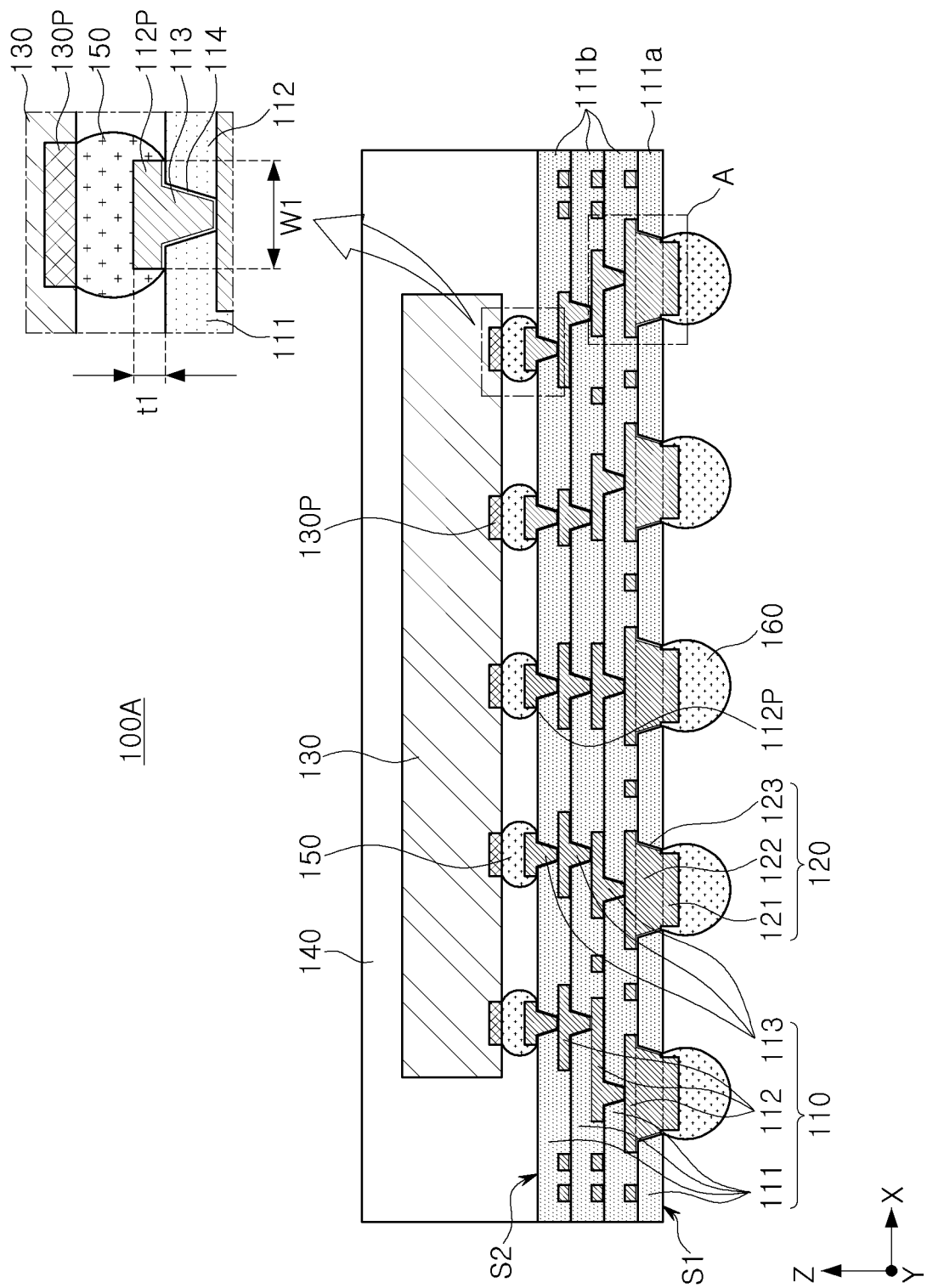
FIG. 1A is a cross-sectional view illustrating a semiconductor package according to an example embodiment.
Figure 1B:
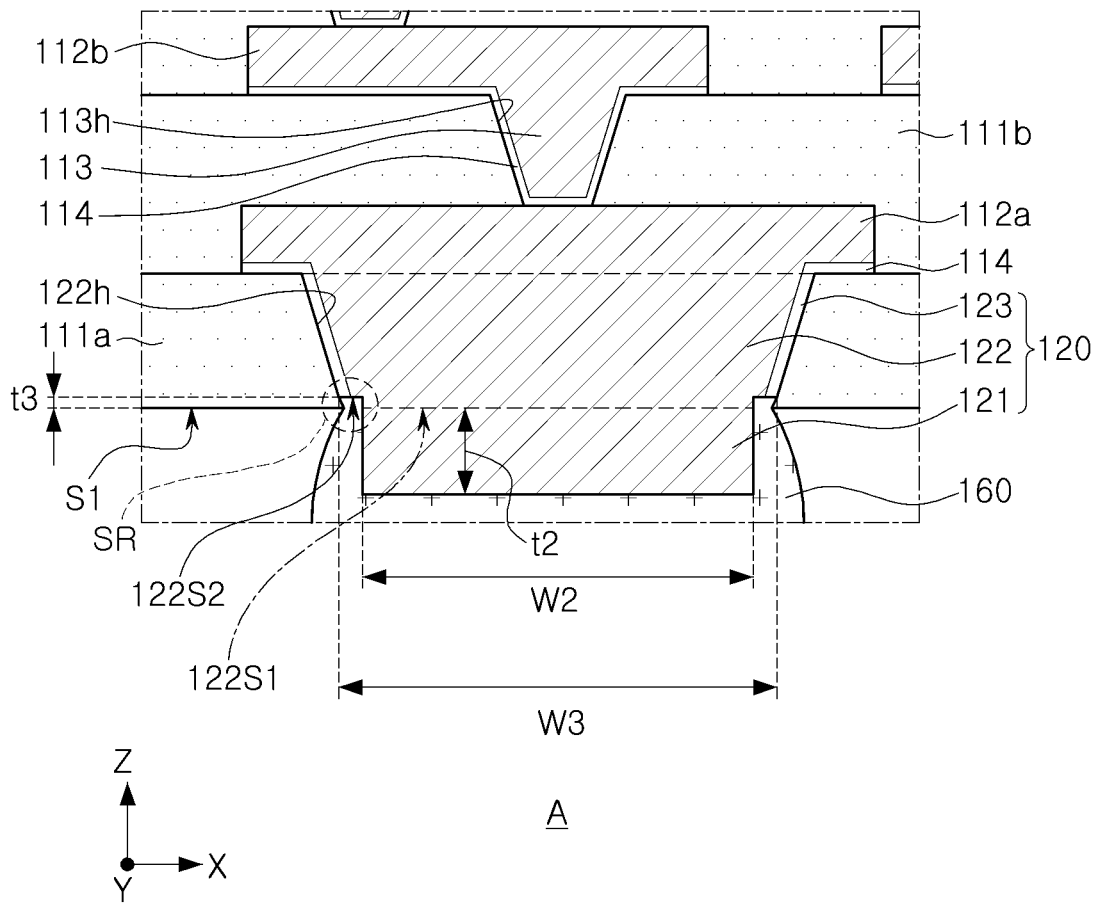
FIG. 1B is a partially enlarged cross-sectional view illustrating area "A" of FIG. 1A.
Figure 1C:
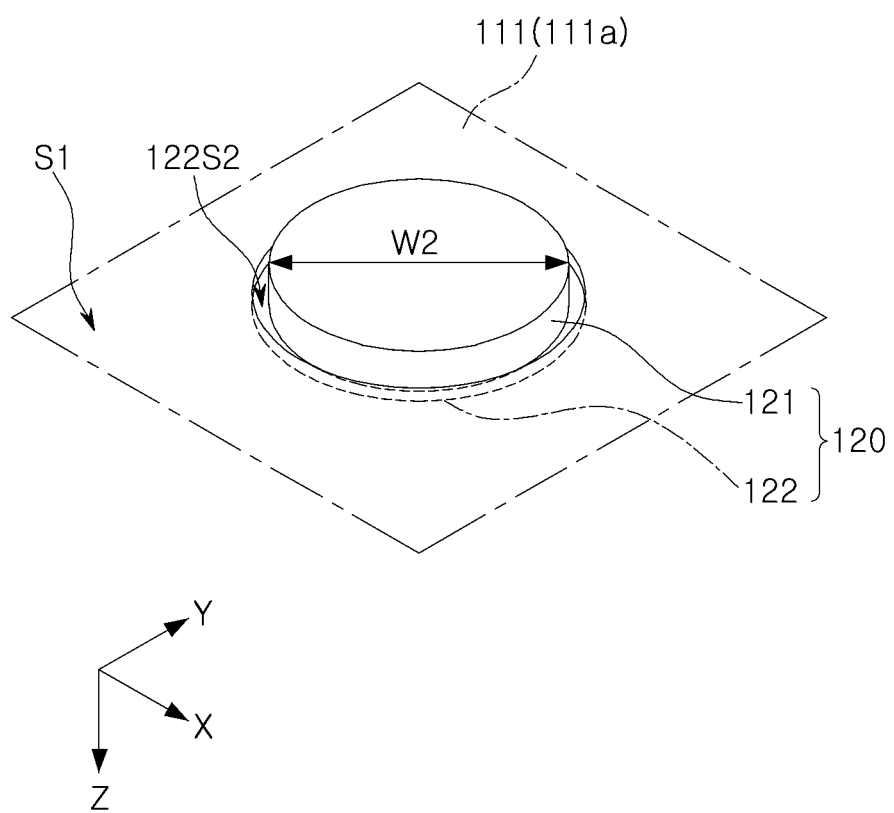
FIG. 1C is a perspective view illustrating some components of the semiconductor package of FIG. 1A.

FIG. 1A is a cross-sectional view illustrating a semiconductor package 100A according to an example embodiment, FIG. 1B is a partially enlarged cross-sectional view illustrating area "A" of FIG. 1A, and FIG. 1C is a perspective view illustrating some components of the semiconductor package 100A of FIG. 1A. FIG. 1C illustrates a portion of a pad 121 of a UBM structure 120 of the semiconductor package 100A of FIG. 1.

Referring to FIGS. 1A to 1C, the semiconductor package 100A may include a redistribution structure 110, the UBM structure 120, a semiconductor chip 130, an encapsulant 140, and a connection bump 160.

The redistribution structure 110 has a first surface S1 and a second surface S2 opposing the first surface S1, and may include an insulating layer 111, a redistribution layer 112, a first via (or, a redistribution via) 113, and a first seed layer 114.

The insulating layer 111 may include a plurality of insulating layers 111 stacked in a vertical direction (Z direction). For example, the insulating layer 111 may include a first insulating layer 111a and one or more second insulating layers 111b stacked on the first insulating layer 111a. The insulating layer 111 may include an insulating material. The insulating material may include a thermosetting resin such as epoxy resin, a thermoplastic resin such as polyimide, or a resin in which an inorganic filler or/and glass fiber (Glass Fiber, Glass Cloth, Glass Fabric) is impregnated in these resins, for example, prepreg, Ajinomoto Build-up Film (ABF), FR-4, Bismaleimide Triazine (BT) or the like. In addition, the insulating layer 111 may include a photosensitive resin such as a photoimageable dielectric (PID) resin. In this case, the insulating layer 111 may be formed to be relatively thinner than an insulating layer formed of other resins, and the first via 113 may be formed relatively more finely than a via formed in the insulating layer formed of the other resins. When the insulating layer 111 is formed of multilayers, the multilayers may include the same material or different materials, and the boundary between insulating layers 111 of different levels may be unclear depending on processes.

The redistribution layer 112 may be disposed on the insulating layer 111. For example, the redistribution layer 112 may include a first redistribution layer 112a on the first insulating layer 111a, and a second redistribution layer 112b on the second insulating layer 111b. The redistribution layer 112 may include a first pad (or bump pad) 112P on an uppermost insulating layer 111b of the plurality of second insulating layers 111b. The first pad 112P may protrude in a vertical direction (Z direction) from the second surface S2 of the redistribution structure 110. The redistribution layer 112 may redistribute a connection pad 130P of the semiconductor chip 130 to a fan-out region. The fan-out region is a region that does not overlap the semiconductor chip 130 in the vertical direction (Z direction). The redistribution layer 112 may include a metal material, for example, copper (Cu), aluminum (Al), silver (Ag), tin (Sn), gold (Au), nickel (Ni), lead (Pb), titanium (Ti), alloys thereof. The redistribution layer 112 may perform various functions depending on a design. For example, the redistribution layer 112 may include a ground (GrouND: GND) pattern, a power (PoWeR: PWR) pattern, and a signal (Signal: S) pattern. The signal S pattern includes various signals, for example, a data signal and the like, excluding the ground (GND) pattern, and the power (PWR) pattern.

The first via 113 may penetrate through the insulating layer 111 and be electrically connected to the redistribution layer 112. For example, the first via 113 penetrates through the second insulating layer 111b to connect the first redistribution layer 112a and the second redistribution layer 112b, or may connect the second redistribution layers 112b of different levels to each other, or may connect the bump pad 112P and the second redistribution layer 112b. The first via 113 may include a signal via, a ground via, and a power via. The first via 113 may include a metal material, for example, copper (Cu), aluminum (Al), silver (Ag), tin (Sn), gold (Au), nickel (Ni), lead (Pb), titanium (Ti), or alloys thereof. The first via 113 may be a filled via in which a metal material is filled in the via hole 113h or a conformal via in which a metal material is formed along an inner wall of a via hole 113h.

The first seed layer 114 may be disposed among the insulating layer 111, the redistribution layer 112 and the first via 113. The first seed layer 114 may cover a lower surface of the redistribution layer 112 and at least a portion of each of the side surfaces and the lower surface of the first via 113. The first seed layer 114 may include a metal material such as copper (Cu), aluminum (Al), silver (Ag), tin (Sn), gold (Au), nickel (Ni), lead (Pb), titanium (Ti), or alloys thereof. The first seed layer 114 may have a single-layer or multi-layered thin film shape. The first seed layer 114 may be comprised of, for example, a first layer including titanium and a second layer including copper.

The under-bump metal (UBM) structure 120 may be disposed on the first surface S1 of the redistribution structure 110, and may include a second pad (or UBM pad) 121, a second via (or UBM bar) 122, and a second seed layer 123. The UBM pad 121, the UBM via 122, and the redistribution layer 112 corresponding to the UBM structure 120 are integrally formed, so that the boundary therebetween may be unclear. In other words, the UBM pad 121, the UBM via 122, and the resdistribution layer 112 may be formed as an integral structure with no visible physical boundaries therebetween.

The second pad 121 may protrude in a vertical direction (Z direction) from the first surface S1 of the redistribution structure 110. The second pad 121 may be defined as a portion protruding in a vertical direction (Z direction) from the first surface S1 of the redistribution structure 110. The size of the second pad 121 may be larger than the size of the first pad 112P. For example, heights t1 and t2 of the first pad 112P and the second pad 121 each range from about 10 μm to about 30 and the diameter (or width) W1 of the first pad 112P may range from about 10 μm to about 50 and the diameter (or width) W2 of the second pad 121 may range from about 100 μm to about 250 μm. The second pad 121 may have the height t2 of 30 μm or more. To improve the reliability of the connection between the second pad 121 and the second via 122, the second pad 121 may be formed in the planar area of the second via 122. For example, the second pad 121 may completely overlap the second via 122 in a direction (Z direction) perpendicular to the first surface S1. At least a portion of the second via 122 may not overlap the second pad 121 in a direction (Z direction) perpendicular to the first surface S1. For example, a minimum width W1 of the first pad 112P may be greater than a minimum width of the first via 113, and a minimum width W2 of the second pad 121 may be less than a minimum width W3 of the second via 122, and the minimum width W2 of the second pad 121 may be greater than the minimum width W1 of the first pad 112P. The second pad 121 may include a metal material similar to the metal material included in the redistribution layer 112.

The second via 122 may penetrate through the insulating layer 111 and connect the redistribution layer 112 and the UBM pad 121 (i.e., the second pad 121). For example, the second via 122 may penetrate through the first insulating layer 111a to connect the first redistribution layer 112a and the second pad 121. The second via 122 may be formed of substantially the same metal material as the second pad 121 and the corresponding redistribution layer 112. The second via 122 may be integrally formed with the second pad 121 and the corresponding redistribution layer 112. The boundary between the second via 122 and the second pad 121 may be unclear. The second via 122 may be defined as a portion corresponding to the thickness of the first insulating layer 111a surrounding the side surface of the second via 122.

The second via 122 has a width greater than the width of the second pad 121 and may improve the reliability of connection between the first redistribution layer 112a, the second pad 121, and the connection bump 160. For example, the width of the lower surface of the second via 122 may be greater than the width of the upper surface of the second pad 121. In this case, the width of the lower surface of the second via 122 may include the width of the seed layer 123 surrounding the side surface of the second via 122. The lower surface of the second via 122 may include a first area 122S1 in contact with the second pad 121, and a second area 122S2 having a step configuration relative to the first area 122S1 and extending outwardly from the first area 122S1, as illustrated in FIG. 1B. In this case, the second area 122S2 may include a lower surface of the seed layer 123 surrounding the side surface of the second via 122. The connection reliability between the UBM structure 120 and the connection bump 160 may be enhanced by the second area 122S2. The first area 122S1 may be positioned on substantially the same level as the second surface S2 of the redistribution structure 120. The second area 122S2 may be located on a higher level than the first area 122S1. The second area 122S2 surrounds the first area 122S1 and may be within a radius of about 1 μm to about 10 μm, based on the first area 122S1. In other words, a circumference of the second area 122S2 is greater than a circumference of the first area 122S1 by between about 1 μm to about 10 μm. Stated another way, the circumference of the second area 122S2 extends outwardly from the circumference of the first area 122S1 by between about 1 μm to about 10 μm.

The second via 122 may have a tapered side surface. Since the second via 122 and the first via 113 are sequentially formed, the second via 122 and the first via 113 may have tapered sides in the same direction. For example, the first via 113 and the second via 122 may each have a tapered shape such that a width of a lower surface thereof is smaller than a width of an upper surface. The second via 122 may have a width greater than that of the first via 113. In this case, the widths of the upper and lower surfaces of the first via 113 may include the width of the first seed layer 114 surrounding the side surface of the first via 113. Also, the widths of the upper and lower surfaces of the second vias 122 may include the width of the second seed layer 123 surrounding the side surfaces of the second vias 122.

The second seed layer 123 may surround a side surface of the second via 122 and may be continuously connected to the first seed layer 114 covering a lower surface of the first redistribution layer 112a. The second seed layer 123 may be conformally formed along the inner wall of the via hole 122h. The lower surface of the second via 122 is not covered by the second seed layer 123 and may be exposed from the second seed layer 123. The lower surface of the second seed layer 123 may form a portion of the second area 122S2 of the second via 122. The second seed layer 123 may be formed of substantially the same material as the first seed layer 114 described above. For example, the second seed layer 123 may include a first layer including titanium and a second layer including copper.

The semiconductor chip 130 may include a connection pad 130P disposed on the second surface S2 of the redistribution structure 110 and electrically connected to the redistribution layer 112. The semiconductor chip 130 may be a logic chip or a memory chip. The logic chip may include, for example, a central processing unit (CPU), a graphics processing unit (GPU), and a field programmable gate array (FPGA), a digital signal processor (DSP), an encryption processor, a microprocessor, a microcontroller, an analog-to-digital converter, an application-specific integrated circuit (ASIC), and the like. The memory chip may include, for example, a volatile memory device such as a dynamic random access memory (DRAM) or a static RAM (SRAM), or a nonvolatile memory device such as a phase change RAM (PRAM), a magnetic RAM (MRAM), a resistive RAM (RRAM), a flash memory, and the like. The semiconductor chip 130 may be mounted on the redistribution structure 110 in a flip-chip bonding method. For example, the lower surface of the semiconductor chip 130 may be spaced apart from the upper surface S2 of the redistribution structure 110, and the connection pad 130P of the semiconductor chip 130 may be connected to the redistribution layer 112 or the bump pad 112P through a separate connection member 150. The connection member 150 may have a land, a ball, or a pin shape. The connection member 150 may include, for example, tin (Sn) or an alloy (Sn—Ag—Cu) containing tin (Sn). Alternatively, the semiconductor chip 130 may be mounted on the redistribution structure 110 in a wire bonding method.

The encapsulant 140 is disposed on the second surface S2 of the redistribution structure 110, and may seal at least portions of the redistribution structure 110 and the semiconductor chip 130. For example, the encapsulant 140 may include a thermosetting resin such as an epoxy resin, a thermoplastic resin such as a polyimide, or a prepreg, Ajinomoto Build-up Film (ABF), FR-4, Bismaleimide Triazine (BT) or Epoxy Molding Compound (EMC) including an inorganic filler or/and glass fiber, or PID.

The connection bump 160 is disposed on the UBM structure 120 and may be connected to the second pad 121 protruding from the first surface S1 of the redistribution structure 110. The connection bump 160 may cover at least a portion of each of the lower surface and the side surface of the second pad 121 and at least a portion of the lower surface of the second via 122. The connection bump 160 may fill a space SR between the first insulating layer 111a and the UBM structure 120 generated by the second area 122S2. Accordingly, adhesion of the connection bump 160 may be improved. The connection bump 160 may include a low melting point metal, for example, tin (Sn) or an alloy (Sn—Ag—Cu) containing tin (Sn). The connection bump 160 may be a land, a ball, or a pin. The connection bump 160 may include a copper pillar or a solder ball.

FIGS. 2A to 2D are partially enlarged cross-sectional views illustrating modified examples of some components of the semiconductor package 100A of FIG. 1A, respectively. FIGS. 2A to 2D illustrate modified examples of the UBM structure 120 corresponding to area "A" of FIG. 1A.

Figure 2A:
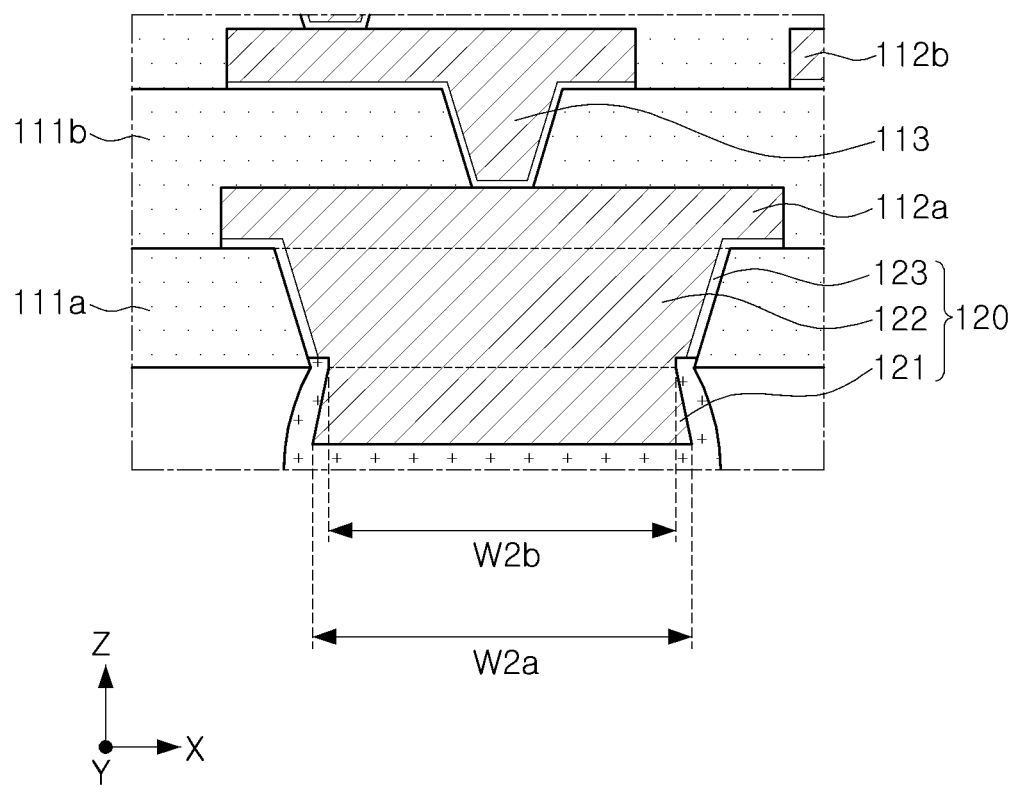
FIGS. 2A to 2D are partially enlarged cross-sectional views illustrating modified examples of some components of the semiconductor package of FIG. 1A, respectively.
Figure 2B:
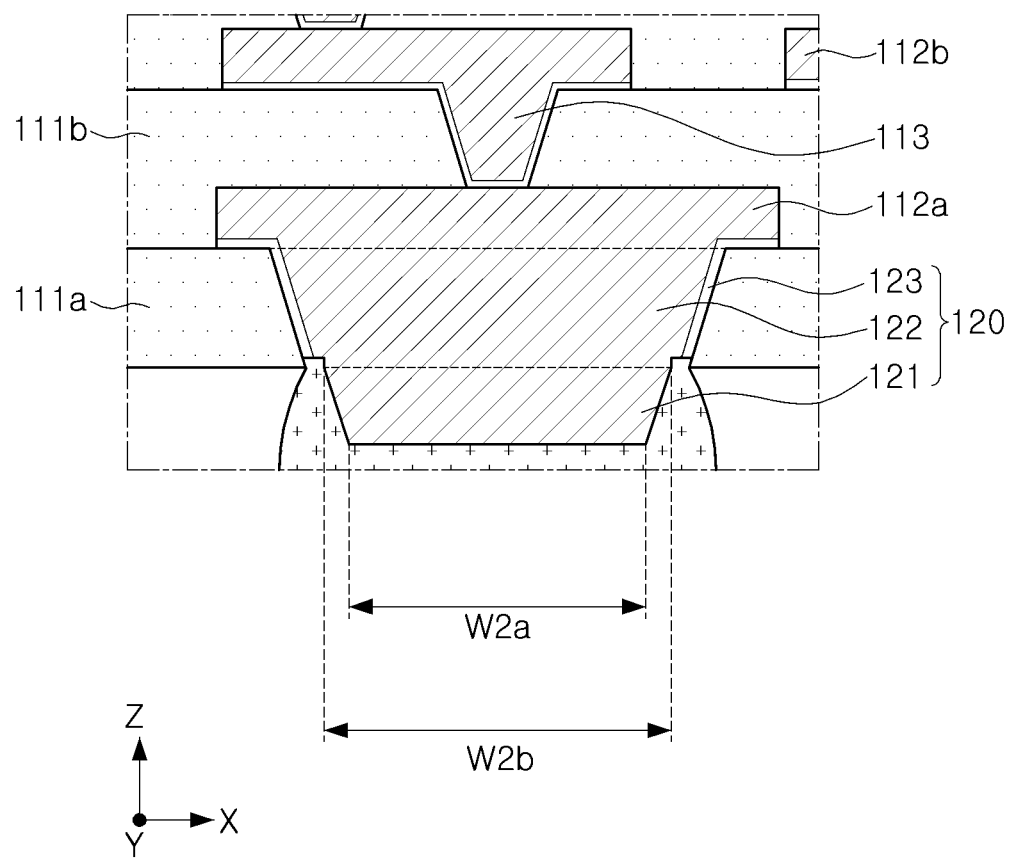

Referring to FIGS. 2A and 2B, in modified examples 100a and 100b, a UBM pad 121 may have a tapered side surface. For example, as illustrated in FIG. 2A, the UBM pad 121 may have a tapered side shape in which a width W2a of the lower surface is greater than a width W2b of the upper surface. In addition, as illustrated in FIG. 2B, the UBM pad 121 may have a tapered side shape in which the width W2a of the lower surface is less than the width W2b of the upper surface.

Figure 2C:
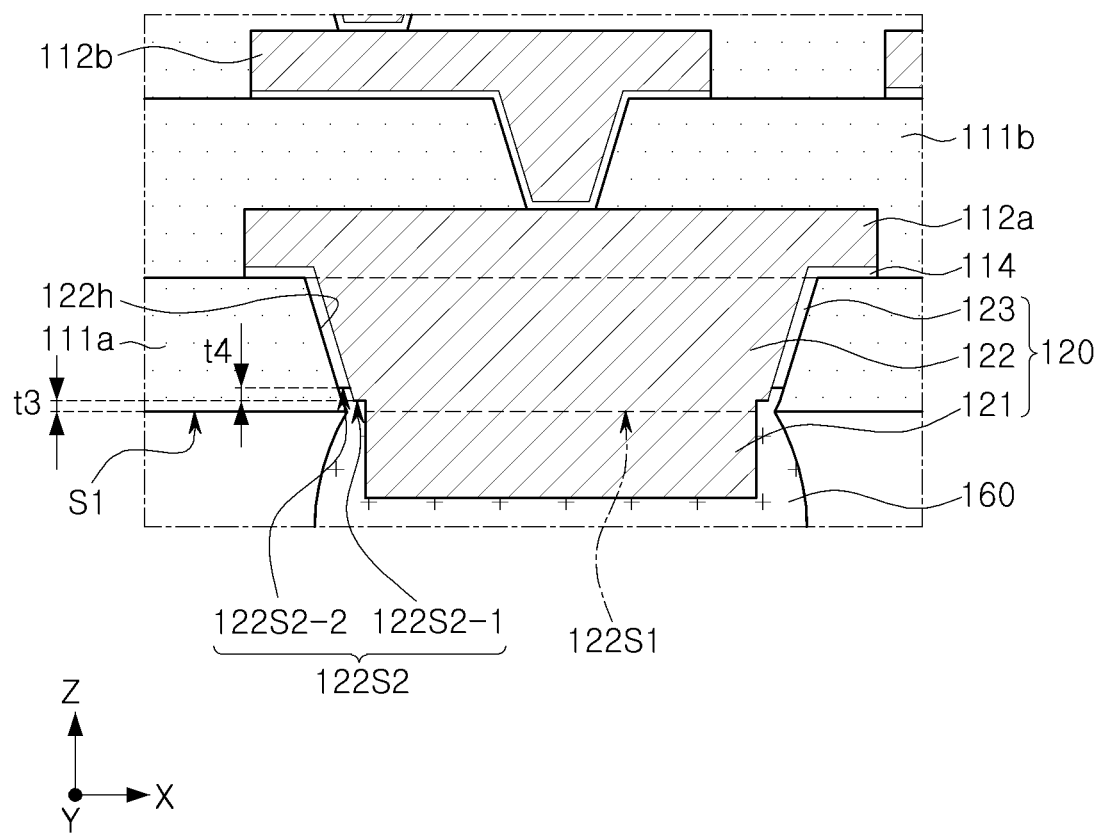

Referring to FIG. 2C, in a modified example 100c, a lower surface 122S2-2 of a second seed layer 123 and a lower surface 122S2-1 of a UBM via 122, in a second area 122S2, may have a step t4. The lower surface 122S2-1 of the UBM via 122 in the second area 122S2 may have a step t3 from a first area 122S1 of a lower surface of the UBM via 122. The connection bump 160 may fill the space formed by the steps t3 and t4 in the second area 122S2.

Figure 2D:
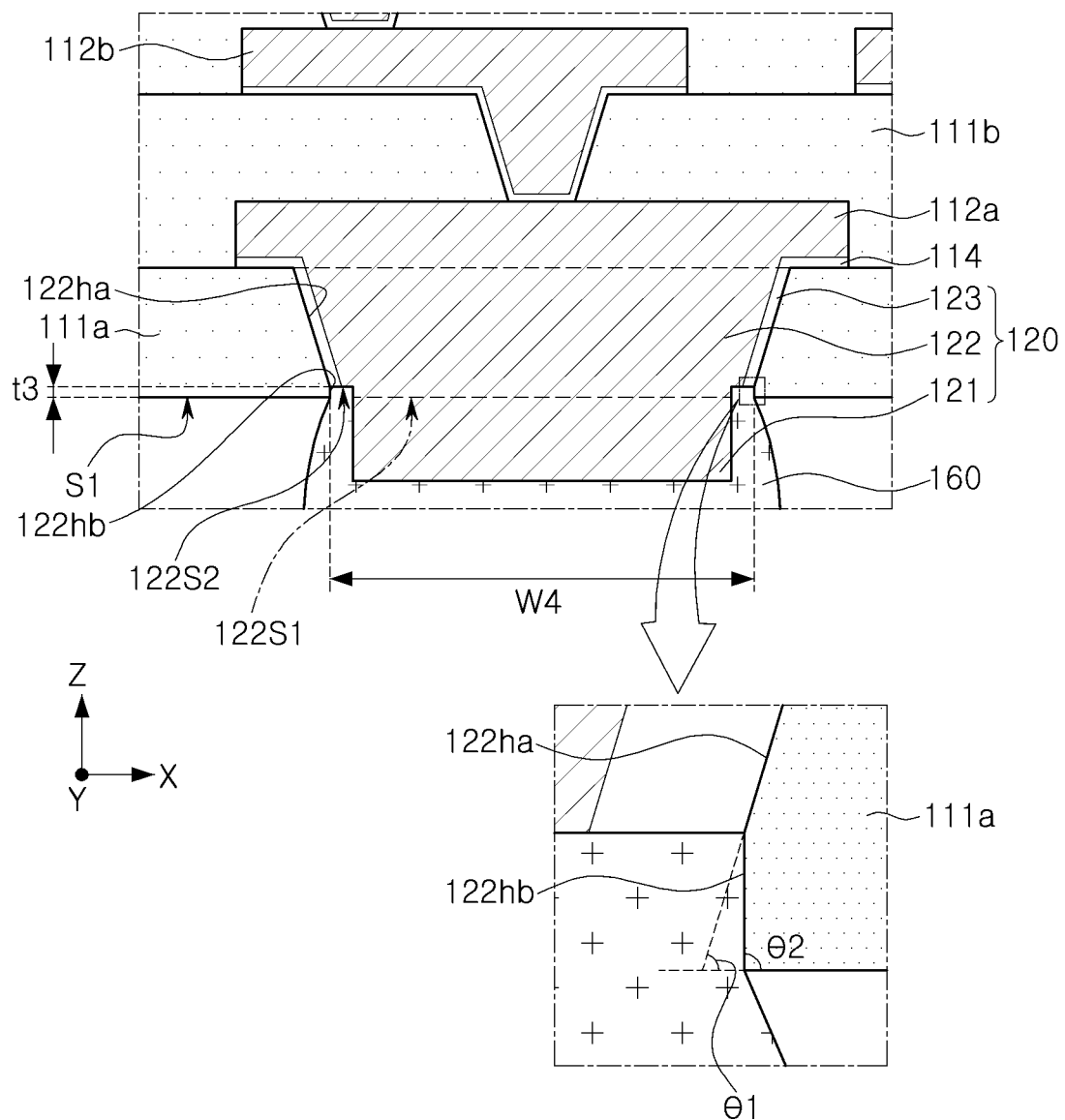

Referring to FIG. 2D, in a modified example 100d, via holes (122ha and 122hb) penetrating through the first insulating layer 111a may include a first via hole 122ha filled with the UBM via 122, and a second via hole 122hb corresponding to the step t3 of the lower surface of the UBM via 122. An inner wall of the second via hole 122hb may be bent and extended on a lower end of the inner wall of the first via hole 122*ha*. An angle θ2 formed by the inner wall of the second via hole 122*hb* with the first surface S1 may be greater than an angle θ1 formed by the inner wall of the first via hole 122*ha* with the first surface S1 (or an extension line of the first surface S1). The angle θ2 of the inner wall of the second via hole 122*hb* may range from 45° to 90°. For example, the first via hole 122*ha* may have a narrower width toward the bottom, and the second via hole 122*hb* may have a substantially constant spacing between inner walls thereof so that widths W4 of upper and the lower portions are similar.

FIGS. 3A to 3J are cross-sectional views schematically illustrating a method of manufacturing the semiconductor package 100A of FIG. 1A.

Figure 3A:
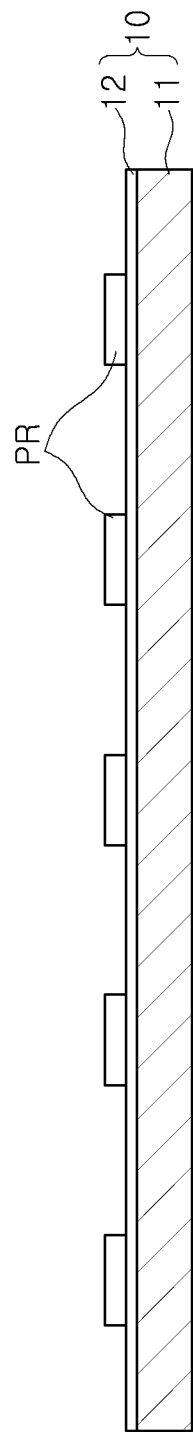
FIGS. 3A to 3J are cross-sectional views schematically illustrating a method of manufacturing the semiconductor package of FIG. 1A.

Referring to FIG. 3A, a patterned photoresist PR may be formed on a carrier 10. The carrier 10 may include a carrier body 11 and a metal layer 12 on the carrier body 11. The metal layer 12 may include a metal material. The metal layer 12 may have a single-layer structure including copper or a multilayer structure in which titanium and copper are stacked on a release layer of silicon and epoxy resin. The material of the carrier body 11 and the metal layer 12 is not particularly limited. The photoresist PR may be patterned by a photolithography process.

Figure 3B:
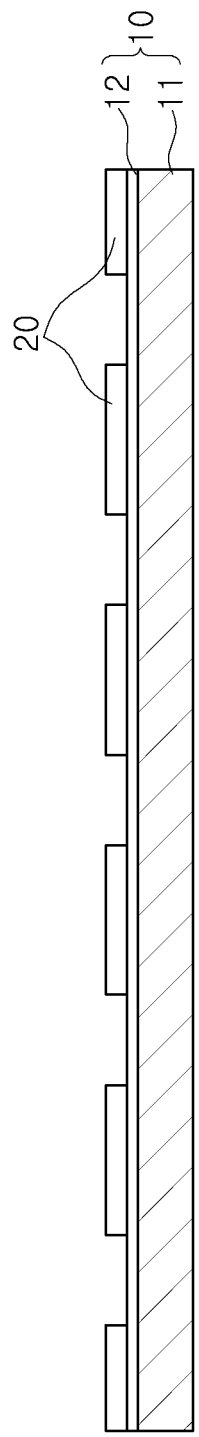

Referring to FIG. 3B, a sacrificial metal layer 20 corresponding to the pattern of the photoresist PR of FIG. 3A may be formed. The sacrificial metal layer 20 may be formed to fill between the photoresists PR of FIG. 3A. The sacrificial metal layer 20 may be formed by a plating process. The photoresist PR of FIG. 3A may be removed after forming the sacrificial metal layer 20. The photoresist PR may be removed by etching process.

Figure 3C:
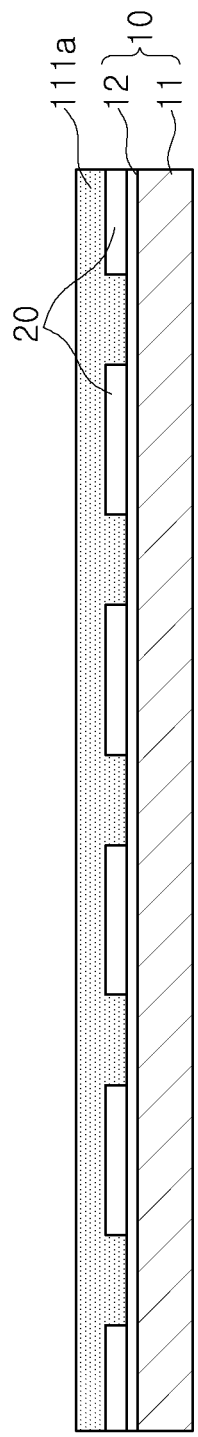

Referring to FIG. 3C, a first insulating layer 111*a* may be formed on the sacrificial metal layer 20. The first insulating layer 111*a* includes an insulating material, for example, PID. The first insulating layer 111*a* may be formed to fill between the sacrificial metal layers 20.

Figure 3D:
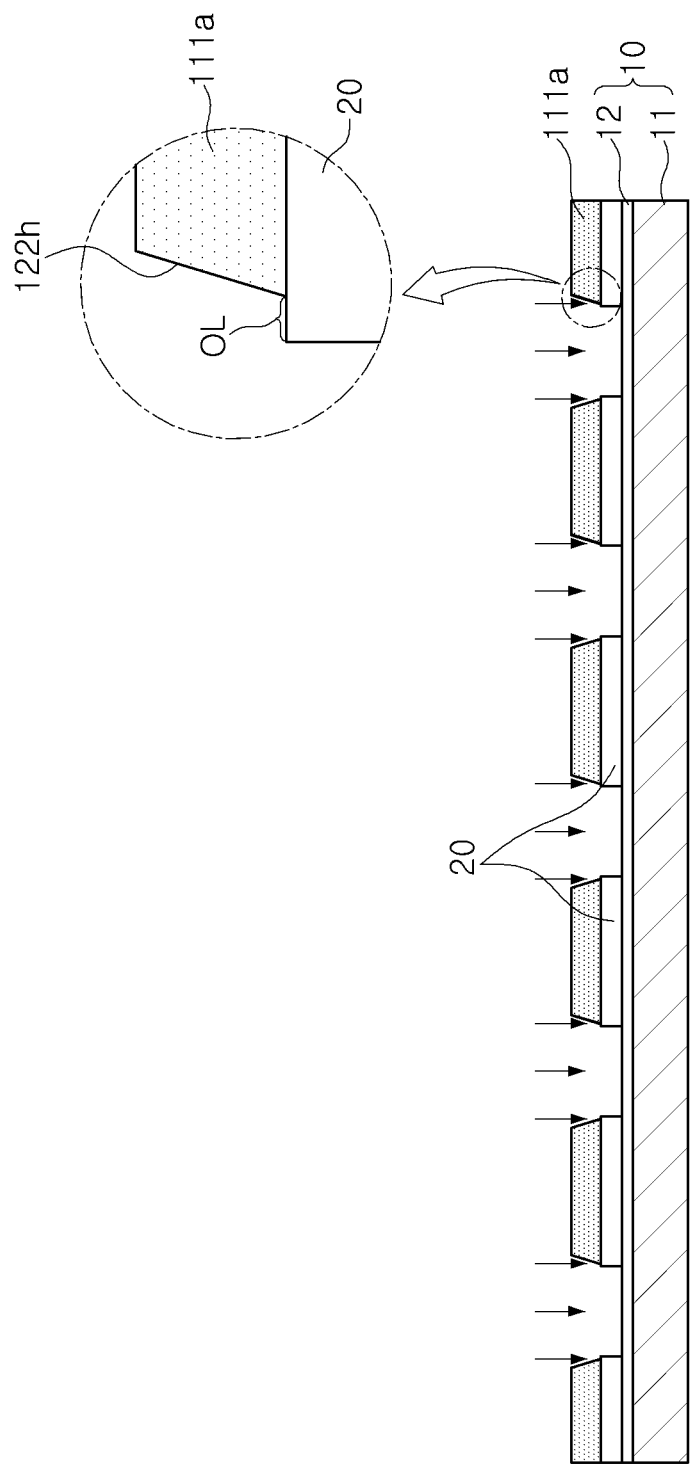

Referring to FIG. 3D, a portion of the first insulating layer 111*a* between the sacrificial metal layers 20 and a portion of the first insulating layer 111*a* on the surface of the sacrificial metal layer 20 may be removed. The first insulating layer 111*a* may be removed using a photolithography process and an etching process. Accordingly, a via hole 122*h* penetrating through the first insulating layer 111*a* may be formed. An overlay region OL from which a portion of the first insulating layer 111*a* has been removed may be formed on the upper surface of the sacrificial metal layer 20.

Figure 3E:
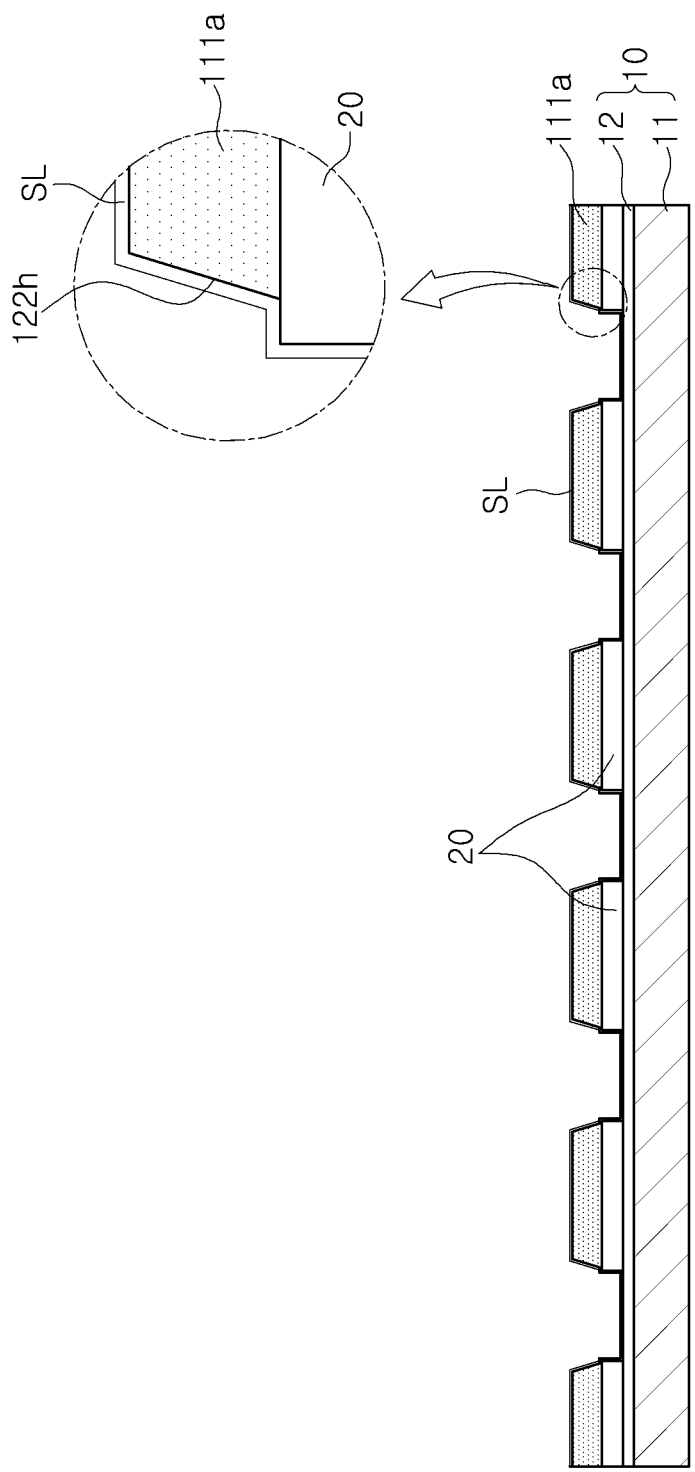

Referring to FIG. 3E, a seed layer SL may be formed on exposed surfaces of the first insulating layer 111*a*, the sacrificial metal layer 20, and the metal layer 12. The seed layer SL may be formed to be bent along the side surface of the sacrificial metal layer 20, the overlay area OL of FIG. 3D, and the inner wall of the via hole 122*h*.

Figure 3F:
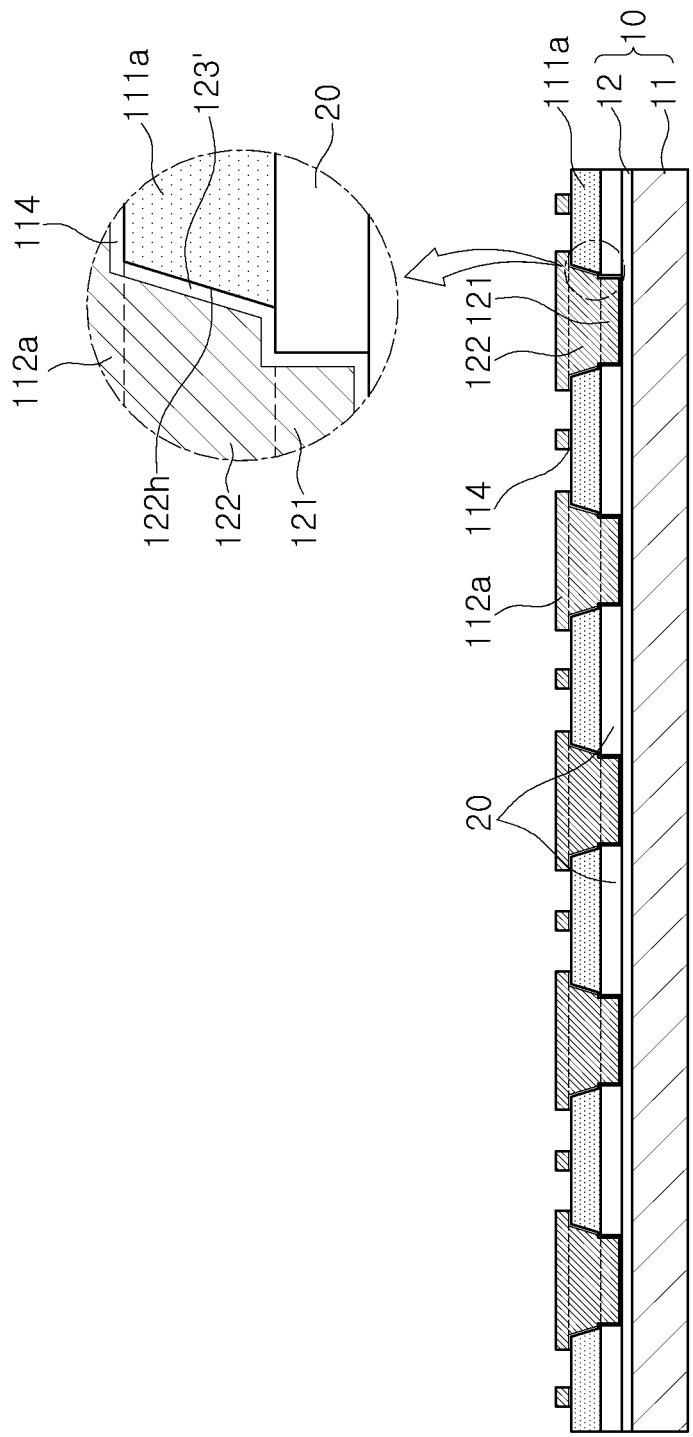

Referring to FIG. 3F, the first redistribution layer 112*a* formed by patterning a plating layer on the first insulating layer 111*a* may be formed by using a photolithography process and etching process. The plating layer may be formed on the seed layer SL of FIG. 3E. The plating layer fills the space between the sacrificial metal layers 20, and the via hole 122*h*, and may be formed up to the upper portion of the first insulating layer 111*a*. As the seed layer SL of FIG. 3E is partially removed during the patterning process, a seed layer 123' surrounding side surfaces of the UBM pad 121 and the UBM via 122 and a seed layer 114 disposed on a lower surface of the first redistribution layer 112*a* may be formed.

Figure 3G:
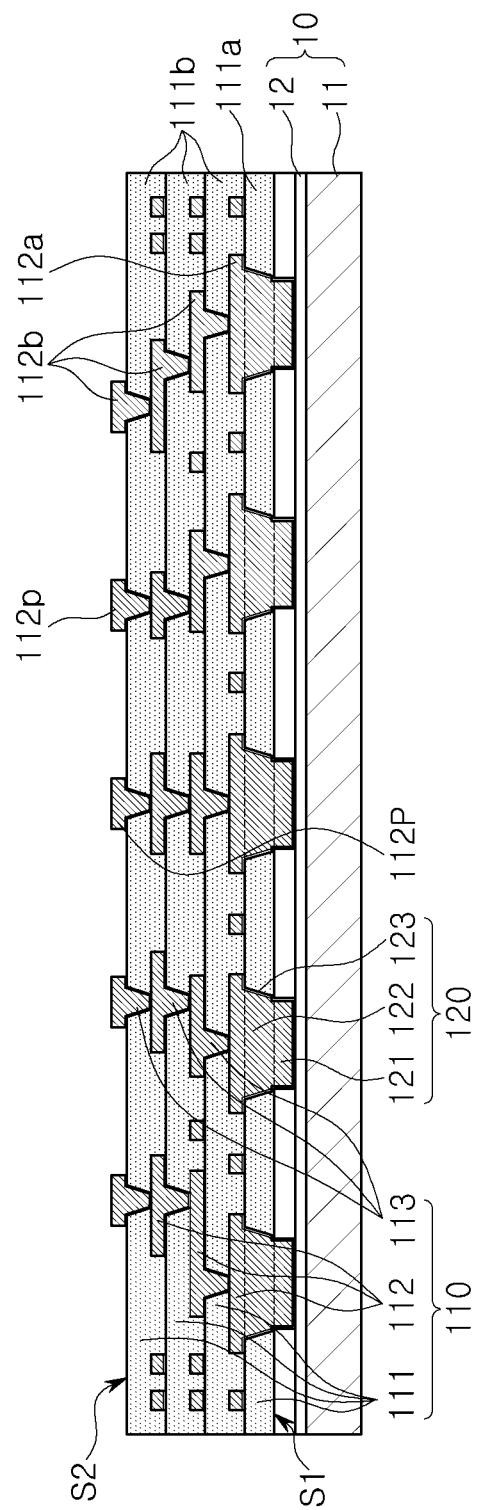

Referring to FIG. 3G, a plurality of second insulating layers 111*b*, second redistribution layers 112*b*, and redistribution vias 113 may be formed on the first insulating layer 111*a*. The second redistribution layers 112*b* may include a bump pad 112P on an uppermost second insulating layer 111*b*. The second insulating layers 111*b* may include PID. The second redistribution layers 112*b* and the redistribution via 113 may be formed using a photolithography process and a plating process. A seed layer ("114" in FIG. 1) surrounding the lower surface of the second redistribution layer 112*b* and the lower surface and the side surface of the redistribution via 113 may be formed by the plating process. By forming the UBM structure 120 earlier than the redistribution layers 112 of the redistribution structure 110, the thickness distribution of the UBM pad 121 may be significantly reduced, and the size of the UBM pad 121 may be significantly increased at the same pitch.

Figure 3H:
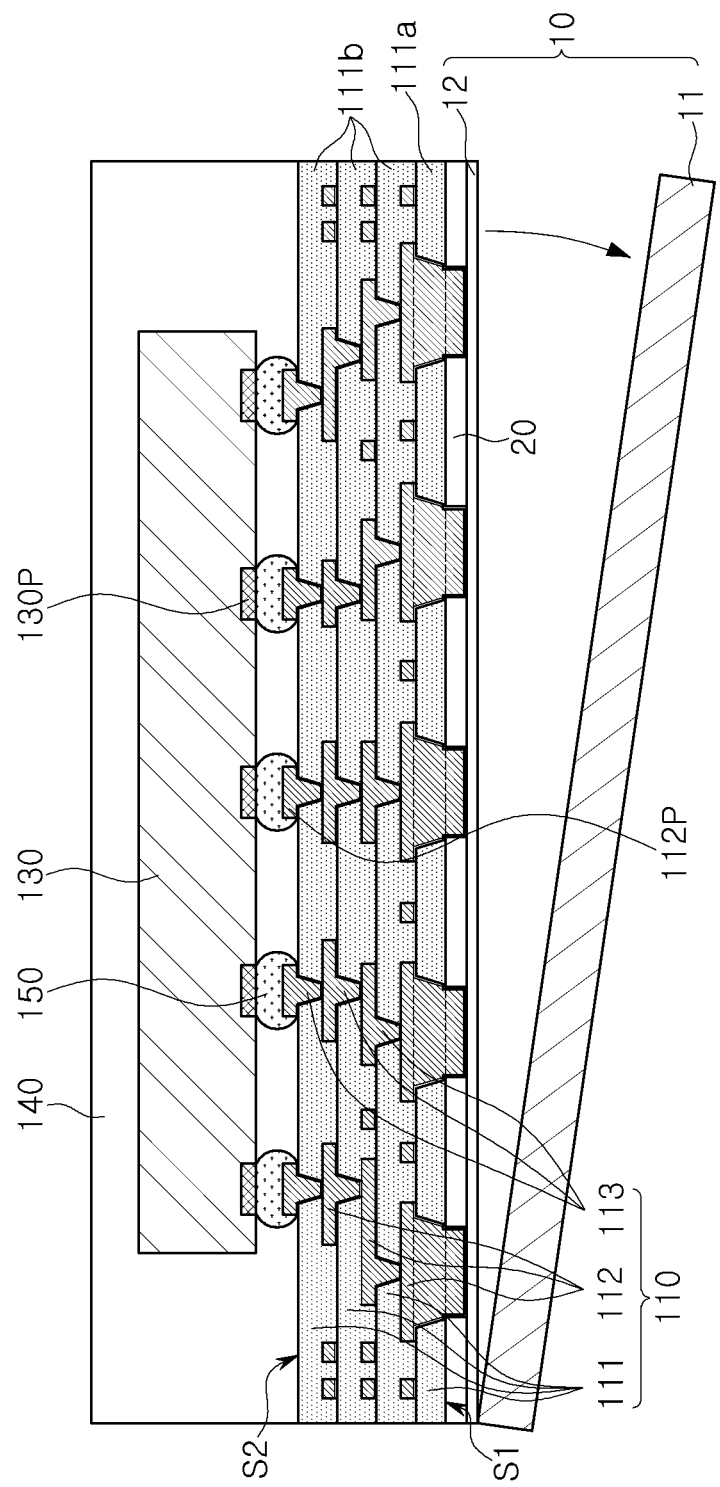

Referring to FIG. 3H, a semiconductor chip 130 may be mounted on the second surface S2 of the redistribution structure 110, and an encapsulant 140 may be formed, as illustrated. The semiconductor chip 130 may be physically and electrically connected to a bump pad 112P through a connection member 150. The encapsulant 140 may include an insulating material, for example, EMC. Next, a carrier body 11 is removed, and the top surface of the encapsulant 140 is attached to a separate carrier, so that the first surface S1 of the redistribution structure 110 may be inverted to be upward.

Figure 3I:
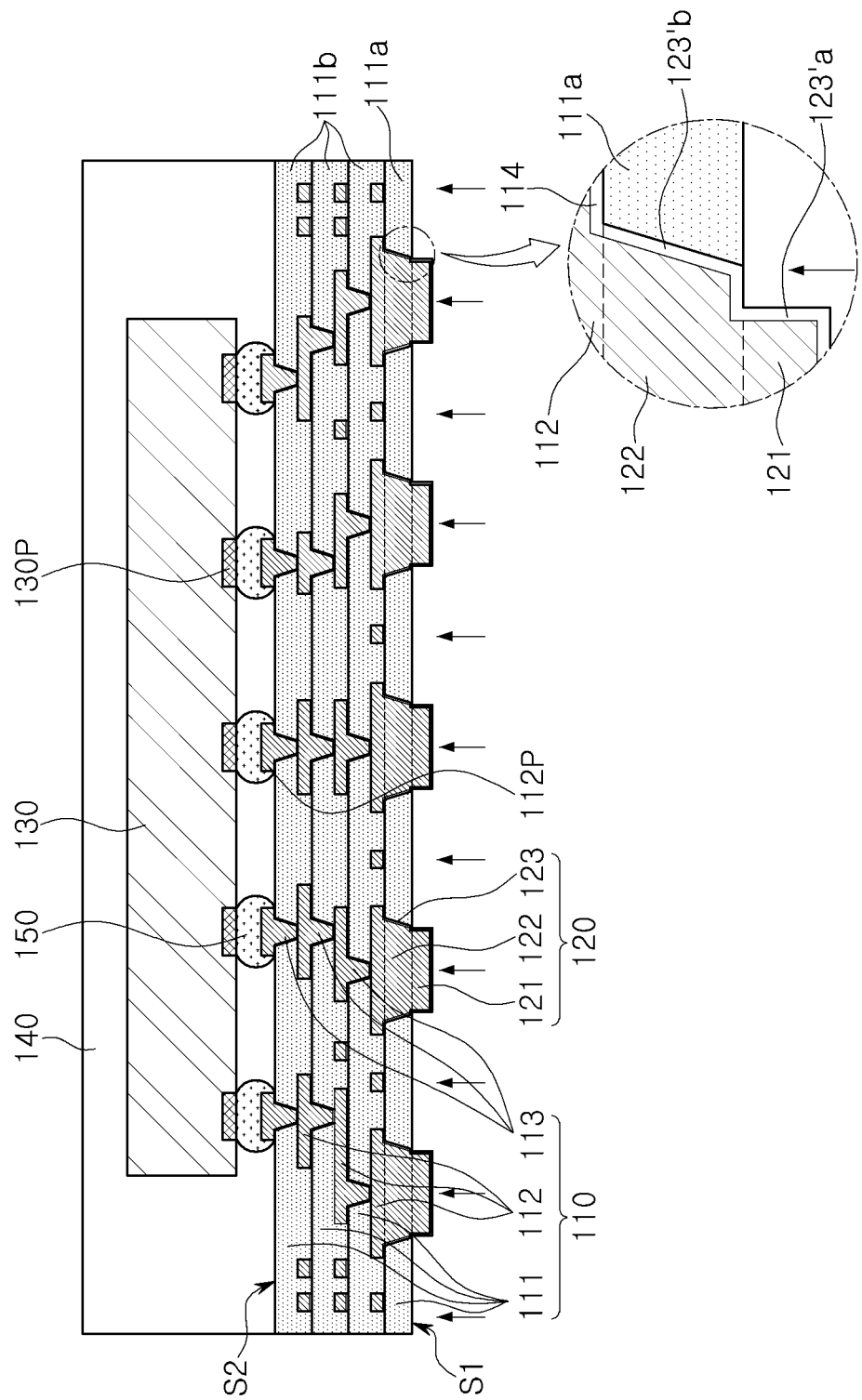

Referring to FIG. 3I, the metal layer 12 and the sacrificial metal layer 20 of FIG. 3H may be removed. The metal layer 12 and the sacrificial metal layer 20 may be removed by an etching process. At least a portion of seed layers 123'*a* and 123'*b* (e.g., titanium layer) surrounding the UBM pad 121 and the UBM via 122 may serve as an etch stopper of the metal layer 12 and the sacrificial metal layer 20 against an etching solution. Accordingly, the seed layer 123'*a* surrounding the lower surface and the side surface of the UBM pad 121 and the seed layer 123'*b* surrounding the lower surface of the UBM via 122 may be exposed from the first insulating layer 111*a*. As the etching solution, a sulfuric acid hydrogen peroxide mixture containing sulfuric acid ($H_2SO_4$) and hydrogen peroxide ($H_2O_2$), or an alkali solution containing potassium hydroxide (KOH), may be used, for example.

Figure 3J:
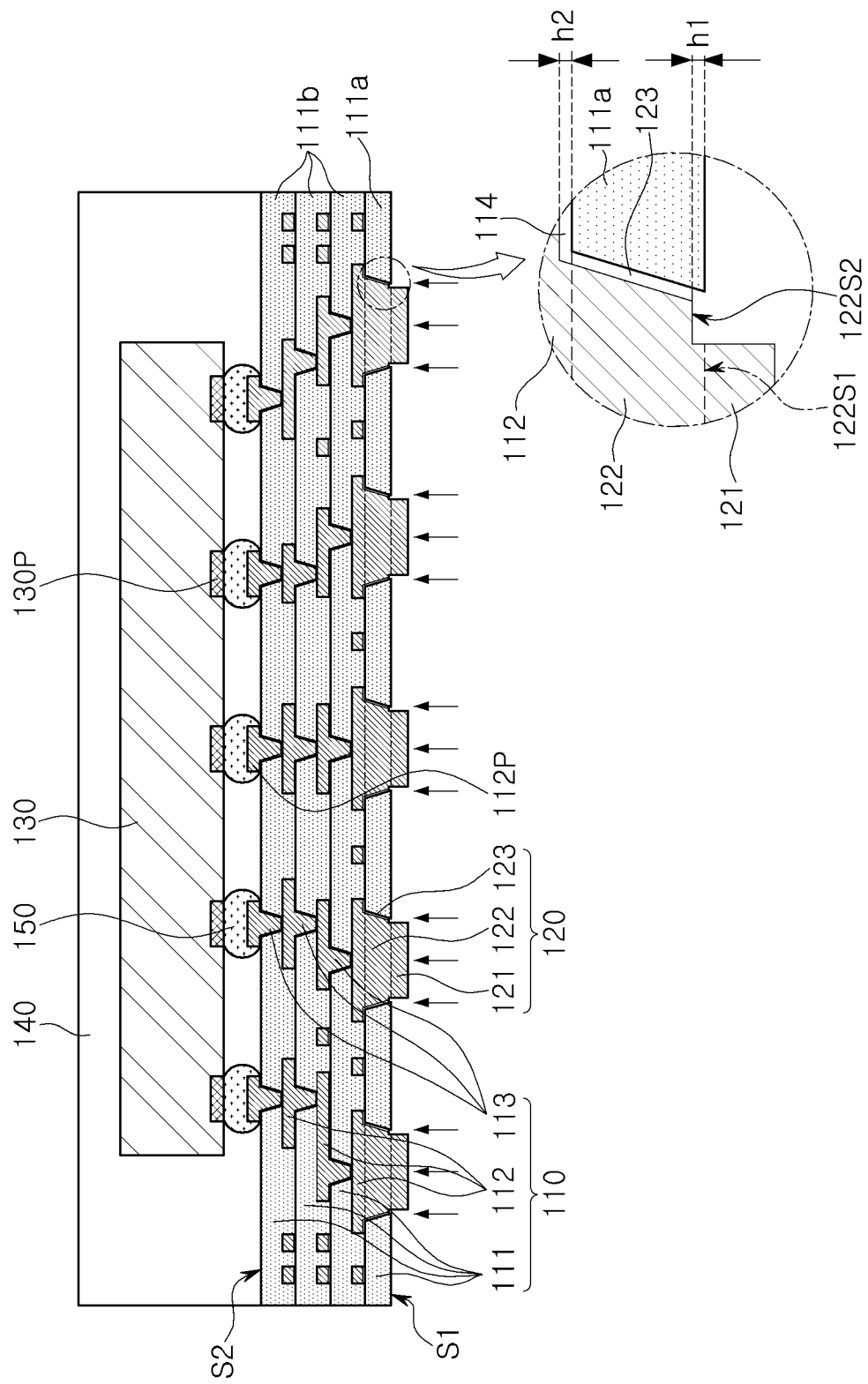

Referring to FIG. 3J, the UBM pad 121 may be exposed by removing portions of the seed layers 123'*a* and 123'*b* of FIG. 3I. A portion protruding onto the first surface S1 of the redistribution structure 110 is defined as the UBM pad 121, and a portion positioned in the first insulating layer 111*a* is defined as the UBM via 122. A lower surface of the UBM via 122 may have a first area 122S1 and a second area 122S2 positioned at different levels. The step configuration between the second area 122S2 and the first area 122S1 may be generated by removing the seed layers 123'*a* and 123'*b* of FIG. 3I. Accordingly, the height h1 of the step configuration between the first area 122S1 and the second area 122S2 may be substantially the same as the thickness h2 of the remaining seed layer 123. As such, in an example embodiment, the UBM structure 120 may be easily formed using an etching process during post assembly processing. Accordingly, the manufacturing cost may be reduced compared to the case in which the redistribution structure 110 is first formed and the UBM structure is formed through a photo process and a plating process. A diffusion barrier layer including nickel (Ni) and gold (Au) may be further formed on the lower surface of the UBM pad 121.

Figure 4A:
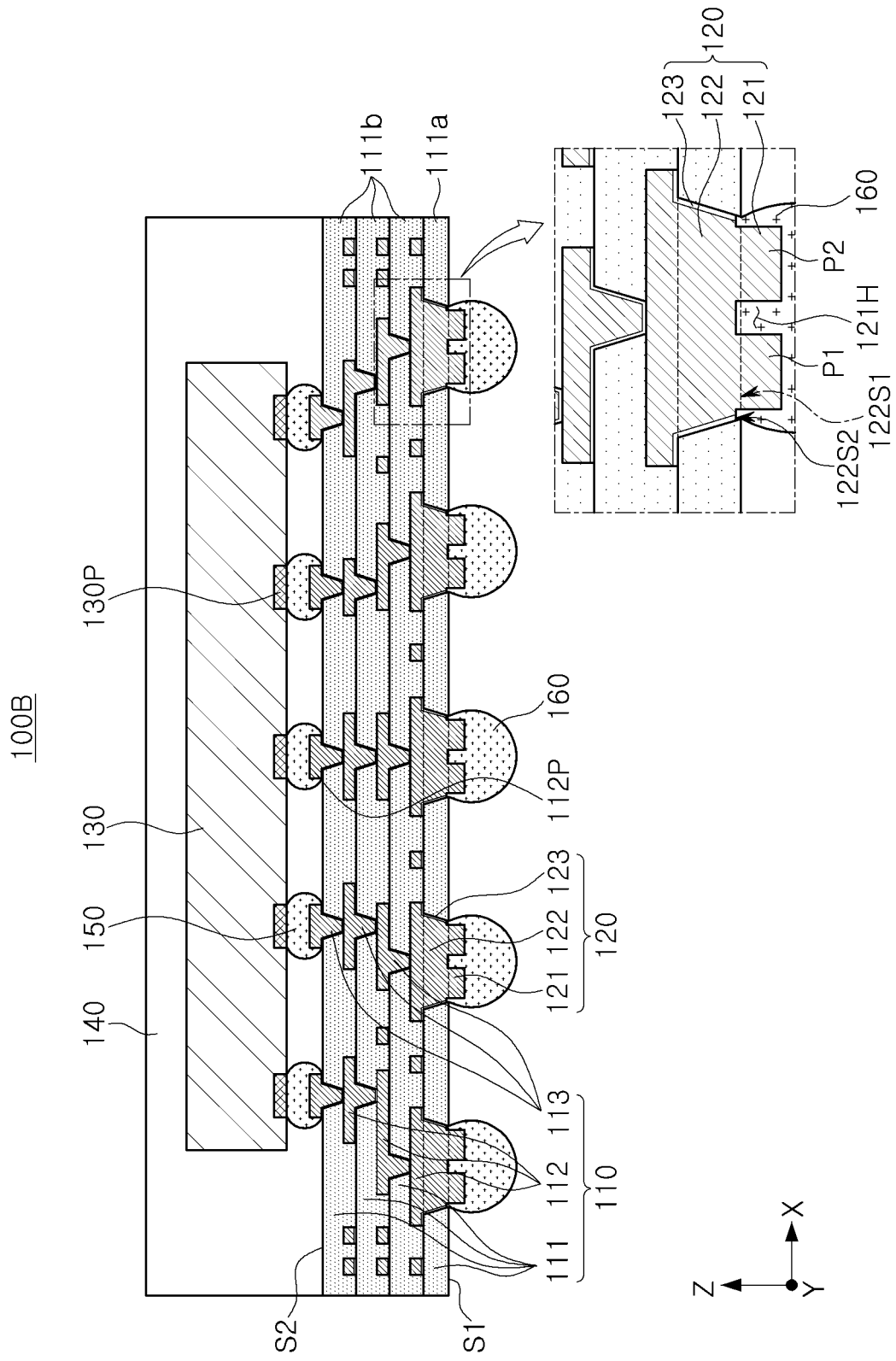
FIG. 4A is a cross-sectional view illustrating a semiconductor package according to an example embodiment.
Figure 4B:
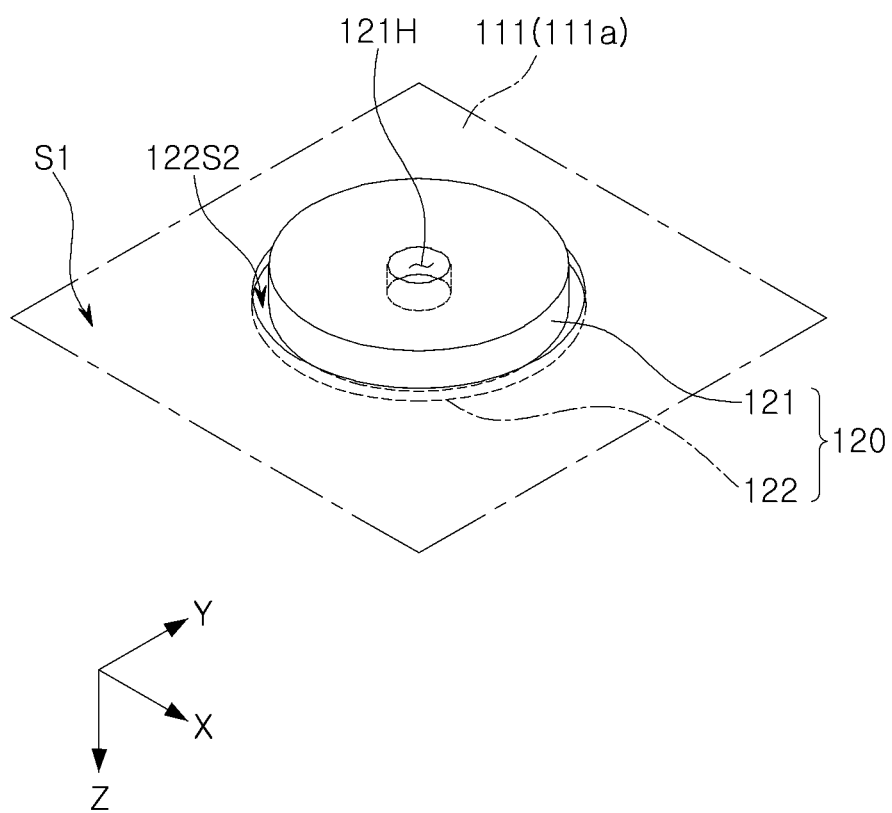
FIG. 4B is a perspective view illustrating some components of the semiconductor package of FIG. 4A.

FIG. 4A is a cross-sectional view illustrating a semiconductor package 100B according to an example embodiment, and FIG. 4B is a perspective view illustrating some components of the semiconductor package 100B of FIG. 4A. FIG. 4B illustrates a portion of the pad 121 of the UBM structure 120 of the semiconductor package 100B of FIG. 4A.

Referring to FIGS. 4A and 4B, the UBM structure 120 of the semiconductor package 100B may include a second pad 121 having at least one or more through-holes 121H extending in a direction (Z direction) perpendicular to the first surface S1 of the redistribution structure 110. For example, the second pad 121 may have the through-hole 121H penetrating through the center thereof. Accordingly, the second pad 121 may have a vertical cross-sectional shape having a first protrusion P1 and a second protrusion P2 formed on both sides of the through-hole 121H. As illustrated in FIG. 4B, the first and second protrusions P1 and P2 may be connected to each other to have a form surrounding the through-hole 121H. The through-hole 121H may be filled by the connection bump 160. The adhesion of the connection bump 160 may be improved by the through-hole 121H.

Figure 4C:
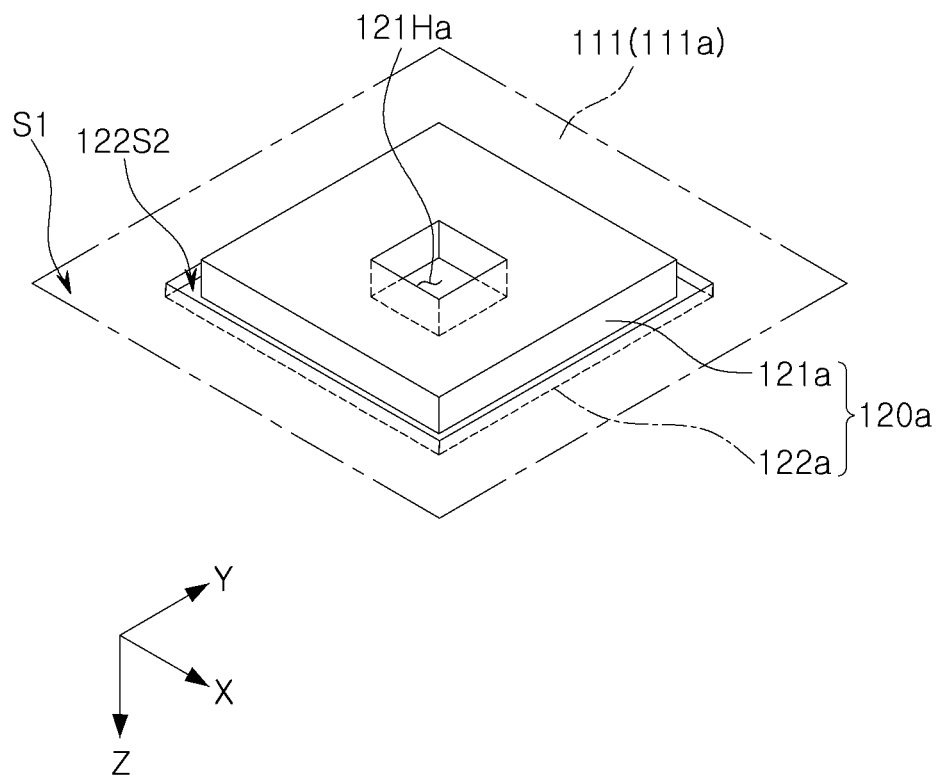
FIGS. 4C to 4E are perspective views illustrating modified examples of some components of FIG. 4B, respectively.
Figure 4D:
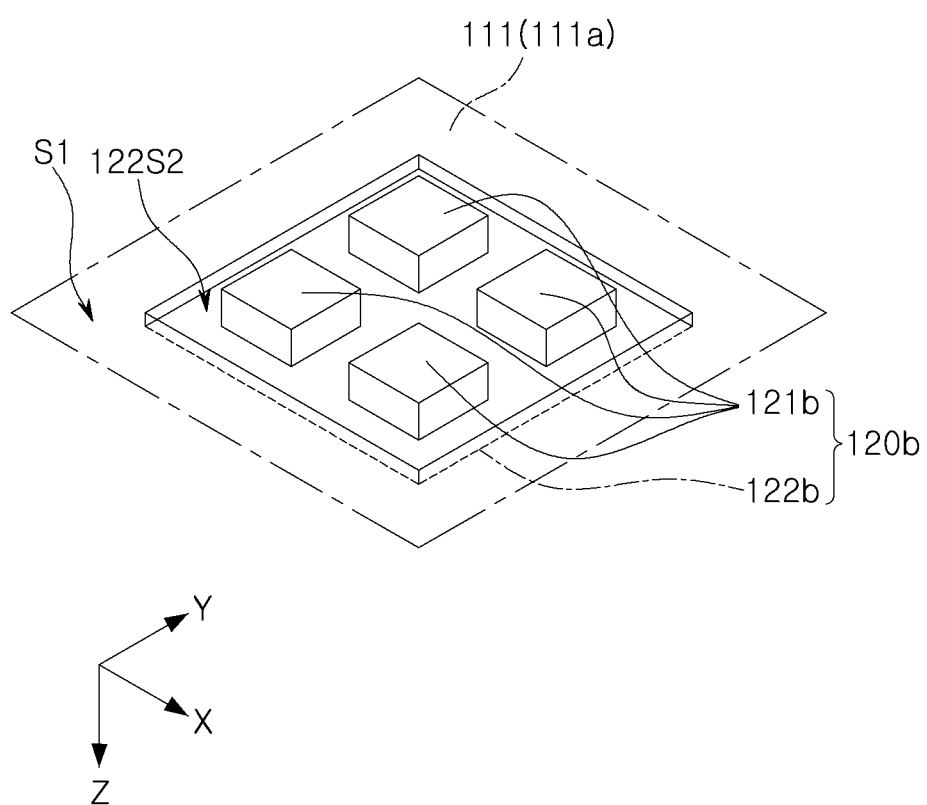
Figure 4E:
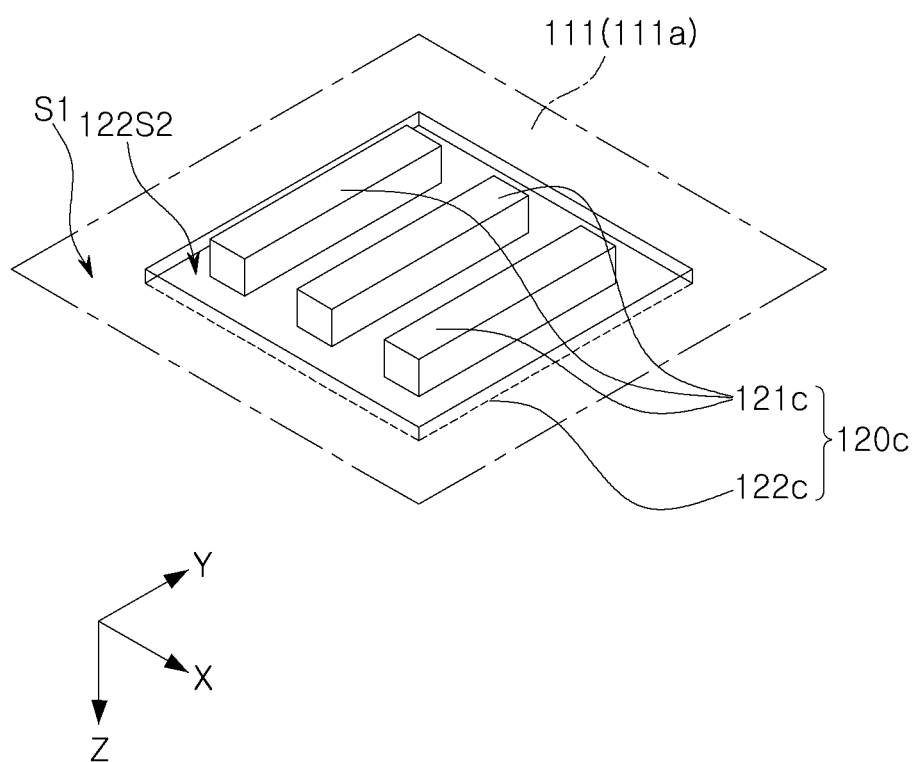

Hereinafter, modified examples of the UBM structure 120 of FIG. 4B will be described with reference to FIGS. 4C to 4E. FIGS. 4C to 4E are perspective views illustrating modified examples of some components of FIG. 4B, respectively.

Referring to FIG. 4C, in a modified example, a UBM structure 120a may have a polygonal (X-Y plane basis) columnar shape having at least one through-hole 121Ha. For example, the second pad 121a may have a quadrangular columnar shape, and the through-hole 121Ha and the second via 122a may also have a shape corresponding to the second pad 121a. The shapes of the second pad 121a, the through-hole 121Ha, and the second via 122a are not particularly limited, and may include various shapes such as a triangle and a pentagon, for example.

Referring to FIG. 4D, in a modified example, a UBM structure 120b may include a plurality of second pads 121b protruding in a vertical direction (Z direction). For example, the plurality of second pads 121b correspond to one second via 122b and may be respectively surrounded by a second area 122S2 having a step configuration relative to the first surface S1. The number and shape of the plurality of second pads 121b are not particularly limited, and may include more or less pads than those illustrated in the drawings.

Referring to FIG. 4E, in a modified example, a UBM structure 120c may include a plurality of second pads 121c having a dam shape extending in a horizontal direction (X or Y direction). For example, the plurality of second pads 121c may respectively have a bar shape extending in a first direction (Y direction) and may be arranged to be spaced apart from each other in a second direction (X direction). The plurality of second pads 121c correspond to one second via 122c, and may respectively be surrounded by a second area 122S2 having a step configuration relative to the first surface S1. The number and shape of the plurality of second pads 121c are not particularly limited, and may include more or less pads than those illustrated in the drawings.

Figure 5:
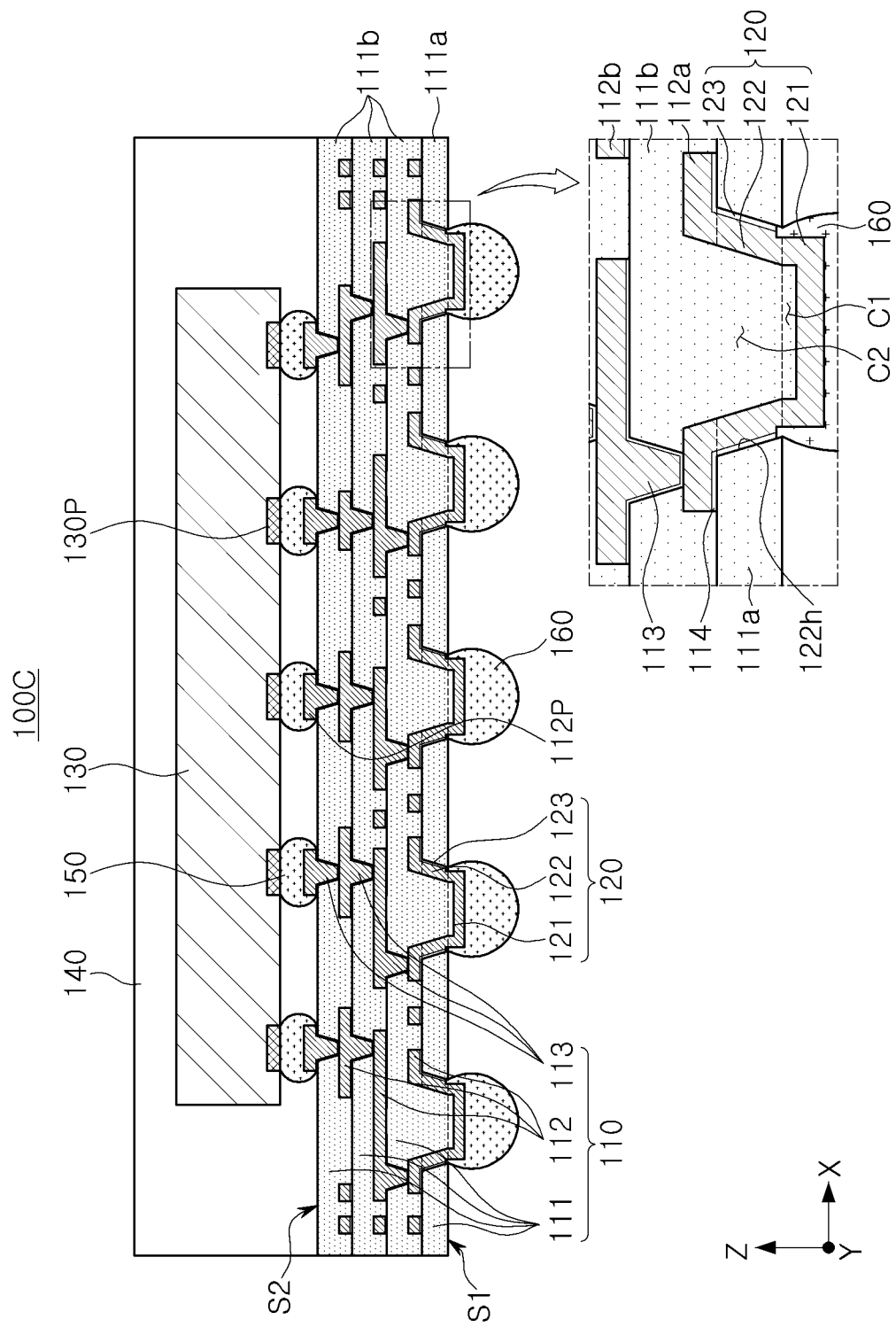
FIG. 5 is a cross-sectional view illustrating a semiconductor package according to an example embodiment.

FIG. 5 is a cross-sectional view illustrating a semiconductor package 100C according to an example embodiment.

Referring to FIG. 5, the semiconductor package 100C may include a UBM structure 120 filled with a second insulating layer 111b therein. A second pad 121 has a first cavity C1 filled with a second insulating layer 111b, and a second via 122 has a second cavity C2 filled with the second insulating layer 111b. The first and second cavities C1 and C2 may be connected to each other. The second cavity C2 may have a shape of a through-hole penetrating through the second via 122, and the first cavity C1 may have a shape of a recess formed in an upper surface of the second pad 121. The first and second cavities C1 and C2 may be formed by conformally plating the plating layer along the surface curvature of the seed layer SL in the plating process of FIG. 3F.

Figure 6:
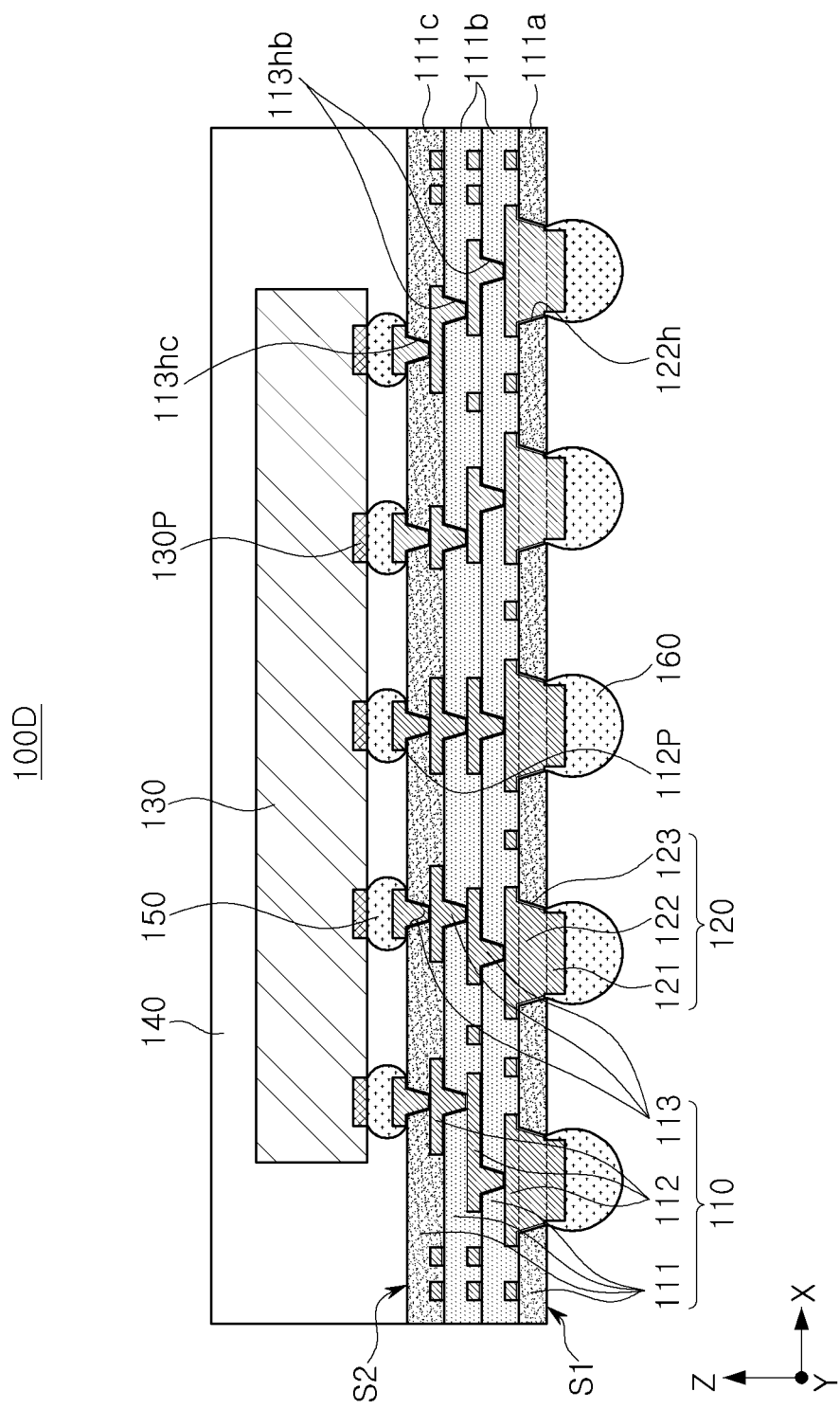
FIG. 6 is a cross-sectional view illustrating a semiconductor package according to an example embodiment.

FIG. 6 is a cross-sectional view illustrating a semiconductor package 100D according to an example embodiment.

Referring to FIG. 6, in the semiconductor package 100D, outermost insulating layers 111a and 111c among a plurality of insulating layers 111 may include a material different from the inner insulating layer 111b. For example, the second insulating layer 111b located on the inner side, among the plurality of insulating layers 111, includes a photosensitive resin (e.g., PID), and the first insulating layer 111a or/and the third insulating layer 111c located on the outer side, among the plurality of insulating layers 111, may include an epoxy resin (e.g., ABF). The first insulating layer 111a or/and the third insulating layer 111c including an epoxy resin may serve as a passivation layer protecting the redistribution layer 112 disposed on an outer side.

A lower via hole (or UBM via hole) 122h penetrating through the first insulating layer 111a, an inner via hole 113hb penetrating through the second insulating layer 111b, and an upper via hole 113hc penetrating through the third insulating layer 111c may be formed in different ways. For example, the first insulating layer 111a and the third insulating layer 111c may include an epoxy resin, and the lower via hole 122h and the upper via hole 113hc may be formed using a laser drill. The second insulating layer 111b may include a photosensitive resin, and the inner via hole 113hb may be formed using a photo process. The inner via hole 113hb may be formed to have a finer pitch compared to the lower via hole 122h and the upper via hole 113hc.

Figure 7:
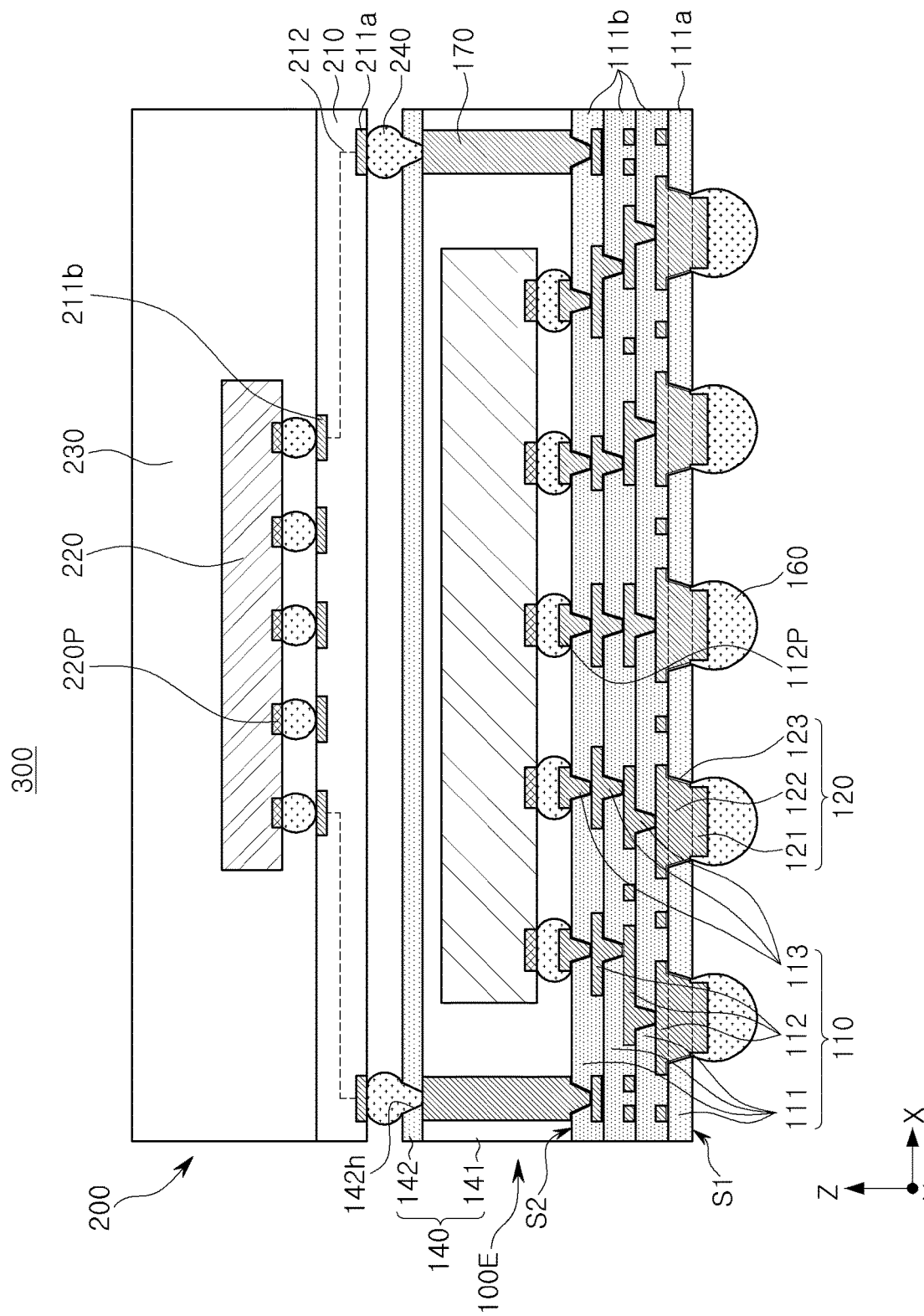
FIG. 7 is a cross-sectional view illustrating a semiconductor package according to an example embodiment.

FIG. 7 is a cross-sectional view illustrating a semiconductor package 300 according to an example embodiment.

Referring to FIG. 7, the semiconductor package 300 may include a first package 100E and a second package 200 coupled to an upper portion of the first package 100E. The first package 100E may further include a vertical connection structure 170 disposed on the second surface S2 of the redistribution structure 110 in the semiconductor package 100A of FIG. 1. The surface of the vertical connection structure 170 may be at least partially covered by an encapsulant 140. The vertical connection structure 170 may be electrically connected to a redistribution layer 112. The vertical connection structure 170 may have a form of a post in which a conductor penetrates through a portion of the encapsulant 140, or may have a form of a multilayer substrate in which an insulating layer and a conductive layer are sequentially stacked.

The vertical connection structure 170 may provide an electrical connection path vertically passing through the first package 100E. The vertical connection structure 170 may be connected to a metal bump 240 through an opening 142h of the encapsulant 140. The encapsulant 140 may include a first encapsulant 141 surrounding a side surface of the vertical connection structure 170, and a second encapsulant 142 on the first encapsulant 141. The first encapsulant 141 and the second encapsulant 142 may include different materials. For example, the first encapsulant 141 may include EMC, and the second encapsulant 142 may include PID. The type of the encapsulant 140 is not limited thereto, and the first and second encapsulants 141 and 142 may also include the same type of material. In a modified example, the upper surface of the semiconductor chip may be exposed by polishing an upper portion of the first encapsulant 141. In addition, a rear redistribution layer electrically connected to the vertical connection structure 170 may be further formed on the second encapsulant 142.

The second package 200 may include a second redistribution structure 210, a second semiconductor chip 220, and a second encapsulant 230. The second redistribution structure 210 may include redistribution pads 211a and 211b which may be electrically connected externally and be disposed on a lower surface and an upper surface, respectively. In addition, the second redistribution structure 210 may include a redistribution circuit 212 disposed therein and connected to redistribution pads 211a and 211b. The redistribution circuit 212 may redistribute a connection pad 220P of the second semiconductor chip 220 to a fan-out region.

The second semiconductor chip 220 includes the connection pad 220P connected to an internal integrated circuit, and the connection pad 220P may be electrically connected to the second redistribution structure 210 through a connection member. The connection member may include a conductive bump or a conductive wire. For example, the connection member may be a solder ball. In a modified example, the connection pad 220P of the second semiconductor chip 220 may directly contact the upper surface of the second redistribution substrate 210 and may be electrically connected to the redistribution circuit 212 through a via inside of the second redistribution structure 210.

The second encapsulant 230 may include a material identical to or similar to that of the first encapsulant 140 of the first package 100E. The second package 200 may be physically and electrically connected to the first package 100E by the metal bump 240. The metal bump 240 may be electrically connected to the redistribution circuit 212 inside of the second redistribution structure 210 through the redistribution pad 211a provided on the lower surface of the second redistribution structure 210. The metal bump 240 may be formed of a low melting point metal, for example, tin (Sn) or an alloy including tin (Sn).

According to example embodiments, a semiconductor package having excellent board level reliability by using a UBM structure having excellent connectivity with a redistribution layer and a via may be provided.

While example embodiments have been illustrated and described above, it will be apparent to those skilled in the art that modifications and variations could be made without departing from the scope of the present inventive concept as defined by the appended claims.

What is claimed is:

1. A semiconductor package comprising:
a redistribution structure comprising an insulating layer, and a redistribution layer disposed on the insulating layer, the redistribution structure having a first surface, and a second surface opposing the first surface;
an under-bump metal (UBM) structure comprising an UBM pad protruding from the first surface of the redistribution structure, and an UBM via penetrating through the insulating layer and connecting the redistribution layer and the UBM pad;
a semiconductor chip disposed on the second surface of the redistribution structure and electrically connected to the redistribution layer;
an encapsulant disposed on the second surface of the redistribution structure and encapsulating at least portions of the redistribution structure and the semiconductor chip; and
a connection bump on the UBM structure,
wherein a lower surface of the UBM via has a first area in contact with the UBM pad, and a second area having a step configuration relative to the first area and that extends outwardly from the first area,
wherein a width of the lower surface of the UBM via is greater than a width of an upper surface of the UBM pad in contact with the first area.

2. The semiconductor package of claim 1, wherein the first area of the UBM via is located on a level that is substantially the same as a level of the second surface of the redistribution structure.

3. The semiconductor package of claim 1, wherein the second area of the UBM via is located on a level higher than a level of the first area.

4. The semiconductor package of claim 1, wherein a circumference of the second area of the UBM via is greater than a circumference of the first area, and wherein a radius of the second area is greater than a radius of the first area by between about 1 µm to about 10 µm.

5. The semiconductor package of claim 1, wherein the UBM via, the UBM pad, and the redistribution layer are an integral structure.

6. The semiconductor package of claim 1, wherein the UBM structure further comprises a seed layer surrounding a side surface of the UBM via, and
wherein a difference between a height of a lower surface of the second area and a height of the first area is substantially the same as a thickness of the seed layer.

7. The semiconductor package of claim 1, wherein the UBM pad has a tapered side surface.

8. The semiconductor package of claim 1, wherein a lower surface of the semiconductor chip is spaced apart from the second surface of the redistribution structure.

9. The semiconductor package of claim 1, wherein the UBM pad has at least one through-hole extending in a direction perpendicular to the first surface of the redistribution structure.

10. The semiconductor package of claim 1, wherein the connection bump covers at least a portion of each of a lower surface and a side surface of the UBM pad and at least a portion of the lower surface of the UBM via.

11. A semiconductor package comprising:
a redistribution structure comprising a first insulating layer, a redistribution layer on the first insulating layer, a second insulating layer covering the redistribution layer, a bump pad on the second insulating layer, and a redistribution via penetrating through the second insulating layer and electrically connecting the redistribution layer and the bump pad, the redistribution structure having a first surface and a second surface opposing the first surface;
a UBM structure disposed on the first surface of the redistribution structure and including a UBM pad protruding from the first surface of the redistribution structure and a UBM via penetrating through the first insulating layer to connect the redistribution layer and the UBM pad; and
a semiconductor chip disposed on the second surface of the redistribution structure and electrically connected to the redistribution layer,
wherein a minimum width of the UBM pad is greater than a minimum width of the bump pad, and
wherein the minimum width of the UBM pad is less than a minimum width of the UBM via.

12. The semiconductor package of claim 11, wherein the redistribution via and the UBM via each have tapered side surfaces, and wherein the respective side surfaces of the redistribution via and the UBM via are tapered in a same direction.

13. The semiconductor package of claim 12, wherein each of the redistribution via and the UBM via has a tapered shape in which a width of a lower surface is less than a width of an upper surface.

14. The semiconductor package of claim 11, further comprising a first seed layer surrounding a side surface and a lower surface of the redistribution via, and a second seed layer surrounding at least a portion of a side surface of the UBM via.

15. The semiconductor package of claim 14, wherein a lower surface of the UBM via protrudes downward beyond the second seed layer.

16. The semiconductor package of claim 11, wherein a height of each of the bump pad and the UBM pad is between about 10 μm to about 30 μm,
   wherein a maximum diameter of the bump pad is between about 10 μm to about 50 μm, and
   wherein a maximum diameter of the UBM pad is between about 100 μm to about 250 μm.

17. The semiconductor package of claim 11, wherein the second insulating layer comprises a photosensitive resin, and
   wherein the first insulating layer comprises an epoxy resin.

* * * * *